United States Patent
Bessho et al.

(10) Patent No.: US 7,672,351 B2
(45) Date of Patent: Mar. 2, 2010

(54) SEMICONDUCTOR LASER APPARATUS

(75) Inventors: Yasuyuki Bessho, Uji (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 39 days.

(21) Appl. No.: 11/390,474

(22) Filed: Mar. 28, 2006

(65) Prior Publication Data

US 2007/0076775 A1    Apr. 5, 2007

(30) Foreign Application Priority Data

Mar. 28, 2005    (JP) .............................. 2005-093233

(51) Int. Cl.
*H01S 5/00* (2006.01)

(52) U.S. Cl. .................................. 372/50.121; 372/50.1
(58) Field of Classification Search .................. 372/50, 372/23
See application file for complete search history.

(56) References Cited

U.S. PATENT DOCUMENTS

| 6,136,623 | A | * | 10/2000 | Hofstetter et al. | 438/28 |
| 2003/0042476 | A1 | * | 3/2003 | Nakahara et al. | 257/10 |
| 2004/0184502 | A1 | * | 9/2004 | Miyachi et al. | 372/50 |

FOREIGN PATENT DOCUMENTS

| JP | 2001-189530 | 7/2001 |
| JP | 2004-207479 | 7/2004 |

OTHER PUBLICATIONS

Chinese Office Action, w/ English translation thereof, issued in Chinese Patent Application No. CN 200610058487.4 dated Apr. 10, 2009.

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

A projection and a raised portion are formed on an upper surface of a blue-violet semiconductor laser device. A projection and a raised portion are formed on a lower surface of a red semiconductor laser device. The height of the projection is smaller than the height of the raised portion, and the height of the projection is smaller than the height of the raised portion. The blue-violet semiconductor laser device and the red semiconductor laser device are joined to each other such that the projections are opposed to each other.

19 Claims, 14 Drawing Sheets

(a)

(b)

(a)

(b)

F I G. 5
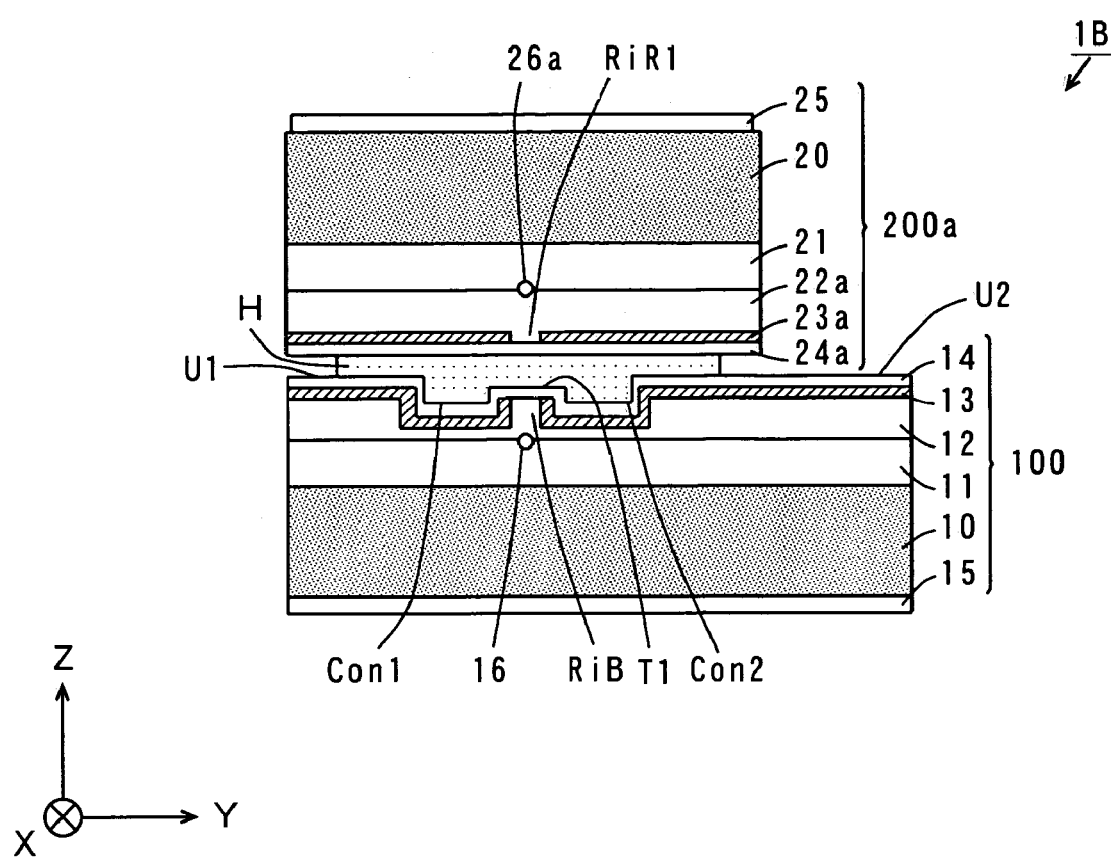

SEMICONDUCTOR LASER APPARATUS

BACKGROUND OF THE INVENTION

1. Field of the Invention

The present invention relates to a semiconductor laser apparatus capable of emitting a plurality of light beams respectively having different wavelengths.

2. Description of the Background Art

Conventionally, semiconductor laser devices emitting infrared light beams having wavelengths of approximately 780 nm (infrared semiconductor laser devices) have been used as light sources for compact disk (CD)/compact disk-recordable (CD-R) drives. Further, semiconductor laser devices emitting red light beams having wavelengths of approximately 650 nm (red semiconductor laser devices) have been used as light sources for conventional digital versatile disk (DVD) drives.

On the other hand, DVDs capable of recording and reading using blue-violet light beams having wavelengths of approximately 405 nm have been developed in recent years. In order to record and read such DVDs, DVD drives using semiconductor laser devices emitting blue-violet light beams having wavelengths of approximately 405 nm (blue-violet semiconductor laser devices) have been also simultaneously developed. In these DVD drives, compatibilities with conventional CD/CD-Rs and DVDs are required.

In this case, compatibilities with conventional CDs, DVDs, and new DVDs are realized by methods of providing a plurality of optical pickup apparatuses respectively emitting infrared light beams, red light beams, and blue-violet light beams to the DVD drives or methods of providing infrared semiconductor laser devices, red semiconductor laser devices, and blue-violet semiconductor laser devices within one optical pickup apparatuses. Since the number of components is increased in these methods, however, it is difficult to miniaturize the DVD drives, simplify the configurations, and reduce the costs.

In order to prevent the number of components from being thus increased, it is effective to provide a plurality of semiconductor laser devices emitting laser beams having different wavelengths in one packages. In this case, in order to improve extraction efficiency of the laser beams and reduce aberration, the respective positions of emission points of the laser beams must be brought near each other.

JP 2004-207479A discloses a semiconductor laser apparatus in which the distance between respective emission points of laser beams is small. In the semiconductor laser apparatus disclosed in JP 2004-207479 A, two light emitting devices respectively emitting laser beams having different wavelengths adhere to each other such that their laser cavities are opposed to each other. Thus, the distance between the respective emission points of the laser beams is reduced.

When the two semiconductor laser devices each having a ridge structure adhere to each other, as disclosed in JP 2004-207479 A, however, the following problems arise. Description is now made using the drawings.

FIG. 12 is a schematic sectional view showing an example of a conventional semiconductor laser apparatus comprising two semiconductor laser devices each having a ridge structure.

A semiconductor laser apparatus 1E shown in FIG. 12 comprises a semiconductor laser device 600 and a semiconductor laser device 700.

The semiconductor laser device 600 has an n-type semiconductor layer 61 and a p-type semiconductor layer 62 on an upper surface of a substrate 60. A ridge Ri1 is formed on an upper surface of the p-type semiconductor layer 62. An insulating layer 63 is formed in a region excluding an upper surface of a ridge Ri1 on the upper surface of the p-type semiconductor layer 62. A p-side pad electrode 64 is formed so as to cover the insulating layer 63 and the upper surface of the ridge Ri1. An n-electrode 65 is formed on a lower surface of the substrate 60.

A voltage is applied between the p-side pad electrode 64 and the n-electrode 65 in the semiconductor laser device 600 so that a first laser beam is emitted from a region (hereinafter referred to as a first emission point) 66 below the ridge Ri1 on a junction interface of then-type semiconductor layer 61 and the p-type semiconductor layer 62.

The semiconductor laser device 700 has an n-type semiconductor layer 71 and a p-type semiconductor layer 72 on a lower surface of a substrate 70. A ridge Ri2 is formed on a lower surface of the p-type semiconductor layer 72. An insulating layer 73 is formed in a region excluding a lower surface of the ridge Ri2 on the lower surface of the p-type semiconductor layer 72. A p-side pad electrode 74 is formed so as to cover the insulating layer 73 and the lower surface of the ridge Ri2. An n-electrode 75 is formed on an upper surface of the substrate 70.

A voltage is applied between the p-side pad electrode 74 and the n-electrode 75 in the semiconductor laser device 700 so that a second laser beam is emitted from a region (hereinafter referred to as a second emission point) 76 above the ridge Ri2 on a junction interface of the n-type semiconductor layer 71 and the p-type semiconductor layer 72.

The semiconductor laser device 600 and the semiconductor laser device 700 are joined to each other such that the ridge Ri1 and the ridge Ri2 are opposed to each other with a solder H.

Here, in a case where the semiconductor laser device 600 and the semiconductor laser device 700 are joined to each other, as described above, the ridge Ri1 and the ridge Ri2 come into contact with each other so that stresses are respectively applied to the ridges Ri1 and Ri2. Thus, the respective characteristics of the ridges Ri1 and Ri2 are degraded. As a result, the reliability of the semiconductor laser apparatus 1E is reduced.

Since the contact area between the ridge Ri1 and the ridge Ri2 is small, the semiconductor laser device 700 cannot be stabilized on the semiconductor laser device 600. Thus, the semiconductor laser device 700 may, in some cases, be joined to the semiconductor laser device 600 in an inclined state, as shown in FIG. 13. As a result, the position of the emission point varies for each semiconductor laser apparatus 1E.

As shown in FIG. 14, a part of the solder H is detoured around respective side surfaces of the n-type semiconductor layer 61 and the p-type semiconductor layer 62 in the semiconductor laser device 600 at the time of joining so that a short may occur. Although a wire W for applying a voltage is connected to the p-side pad electrode 64 in the semiconductor laser device 600, the melted solder H flows out to the vicinity of an end of the p-side pad electrode 64 so that defective connection of the wire W may occur.

Furthermore, in a case where the semiconductor laser apparatus 1E in which the solder H flows out to the end of the p-side pad electrode 64, as shown in FIG. 14, is joined to a sub-mount 800, which is an L shape in cross section, with the semiconductor laser device 700 positioned on its lower side, as shown in FIG. 15, the semiconductor laser apparatus 1E may, in some cases, be joined in an inclined state with respect to the sub-mount 800 by the effect of the solder H. Thus, the manufacturing yield of the semiconductor laser apparatus 1E is reduced.

SUMMARY OF THE INVENTION

An object of the present invention is to provide a semiconductor laser apparatus in which the distance between respective emission points of laser beams is small and which is high in reliability and has improved manufacturing yield.

(1)

A semiconductor laser apparatus according to one aspect of the present invention comprises a first semiconductor laser device comprising a first semiconductor layer having a first emission point emitting a light beam having a first wavelength; and a second semiconductor laser device comprising a second semiconductor layer having a second emission point emitting a light beam having a second wavelength, one surface of the first semiconductor layer and one surface of the second semiconductor layer being joined to each other, a striped projection being provided on at least one of the one surface of the first semiconductor layer and the one surface of the second semiconductor layer, a raised portion being provided apart from the projection on at least one of the one surface of the first semiconductor layer and the one surface of the second semiconductor layer, and the height of the raised portion being not less than the height of the projection.

In the semiconductor laser device, the striped projection is provided on at least one of the one surface of the first semiconductor layer in the first semiconductor laser device and the one surface of the second semiconductor layer in the second semiconductor laser device. The raised portion is provided apart from the projection on at least one of the one surface of the first semiconductor layer in the first semiconductor laser device and the one surface of the second semiconductor layer in the second semiconductor laser device. Here, the height of the raised portion is not less than the height of the projection. Further, the one surface of the first semiconductor layer and the one surface of the second semiconductor layer are joined to each other.

In this case, the one surface of the first semiconductor layer in the first semiconductor laser device and the one surface of the second semiconductor layer in the second semiconductor laser are joined to each other, so that the distance between the first emission point of the first semiconductor layer and the second emission point of the second semiconductor layer is reduced. This allows both the first emission point and the second emission point to be brought near the center of a package. As a result, a common optical system can be used for the laser beams respectively emitted from the first emission point and the second emission point.

The height of the raised portion is not less than the height of the projection, so that the first semiconductor laser device and the second semiconductor laser device come into contact with each other in at least the raised portion. Thus, a stress applied by the projection provided on the one surface of one of the semiconductor laser devices to the one surface of the other semiconductor laser device and a stress created in the projection are reduced. Consequently, the respective characteristics of the first and second semiconductor laser devices are prevented from being degraded by the stresses. As a result, the reliability of the semiconductor laser apparatus is improved.

The first semiconductor laser device and the second semiconductor laser device come into contact with each other in at least the raised portion, so that the contact area between the first semiconductor laser device and the second semiconductor laser device is increased. This allows the first semiconductor laser device and the second semiconductor laser device to be joined to each other in a stable state. As a result, the assembling precision of the semiconductor laser apparatus is improved, so that the manufacturing yield thereof is improved.

The first semiconductor laser device and the second semiconductor laser device can be reliably joined to each other using a small amount of bonding material. This prevents a part of the bonding material from being detoured around a side surface of the first or second semiconductor layer. As a result, the first and second semiconductor laser devices are prevented from being short-circuited, so that the manufacturing yield is improved.

(2)

The raised portion may comprise raised portions provided apart from the projection on both sides thereof.

In this case, the contact area between the first semiconductor laser device and the second semiconductor laser device is further increased. This allows the first semiconductor laser device and the second semiconductor laser device to be joined to each other in a more stable state. As a result, the assembling precision of the semiconductor laser apparatus is further improved, so that the manufacturing yield thereof is further improved.

(3)

The projection may comprise a first projection provided on the one surface of the first semiconductor layer and a second projection provided on the one surface of the second semiconductor layer, the raised portion may comprise a first raised portion provided apart from the first projection on the one surface of the first semiconductor layer and a second raised portion provided apart from the second projection on the one surface of the second semiconductor layer, and the total height of the first and second raised portions may be not less than the total height of the first and second projections.

In this case, the first semiconductor laser device and the second semiconductor laser device come into contact with each other in the first raised portion and the second raised portion. Thus, stresses respectively applied to the second and first semiconductor laser devices by the first and second projections are reduced. Consequently, the respective characteristics of the first and second semiconductor laser devices are prevented from being degraded by the stresses. As a result, the reliability of the semiconductor laser apparatus is improved.

The first semiconductor laser device and the second semiconductor laser device come into contact with each other in the first and second raised portions, so that the contact area between the first semiconductor laser device and the second semiconductor laser device is increased. This allows the first semiconductor laser device and the second semiconductor laser device to be joined to each other in a stable state. As a result, the assembling precision of the semiconductor laser apparatus is improved, so that the manufacturing yield thereof is improved.

The first semiconductor laser device and the second semiconductor laser device can be reliably joined to each other using a small amount of bonding material. This prevents a part of the bonding material from being detoured around the side surface of the first or second semiconductor layer. As a result, the first and second semiconductor laser devices are prevented from being short-circuited, so that the manufacturing yield is improved.

(4)

The first projection and the first emission point may be positioned along a direction substantially perpendicular to the one surface of the first semiconductor layer, the second projection and the second emission point may be positioned along a direction substantially perpendicular to the one surface of the second semiconductor layer, and the first and second semiconductor laser devices may be arranged such that the first projection and the second projection are opposed to each other.

In this case, the first emission point and the second emission point are in close proximity to each other on a substantially straight line. This allows both the first emission point and the second emission point to be brought nearer the center of the package. As a result, a common optical system can be used for laser beams respectively emitted from the first emission point and the second emission point.

(5)

The first semiconductor laser device may comprise a first active layer and a first cladding layer in this order, the first cladding layer comprising a first flat portion and a first ridge on the flat portion, and the first projection being formed so as to cover the first ridge, and the second semiconductor laser device may comprise a second active layer and a second cladding layer in this order, the second cladding layer comprising a second flat portion and a second ridge on the flat portion, and the second projection being formed so as to cover the second ridge.

In this case, the first emission point is formed in a region of the first active layer below the first projection, and the second emission point is formed in a region of the second active layer below the second projection. Consequently, the first and second emission points can be brought near each other.

(6)

The first raised portion may comprise first raised portions provided apart from the first projection on both sides thereof, and the second raised portion may comprise second raised portions provided apart from the second projection on both sides thereof.

In this case, the contact area between the first semiconductor laser device and the second semiconductor laser device is further increased. This allows the first semiconductor laser device and the second semiconductor laser device to be joined to each other in a more stable state. As a result, the assembling precision of the semiconductor laser apparatus is further improved, so that the manufacturing yield thereof is further improved.

(7)

The projection may be provided on the one surface of the first semiconductor layer, and the raised portion may be provided apart from the projection on the one surface of the first semiconductor layer.

In this case, the first semiconductor laser device and the second semiconductor laser device come into contact with each other in the raised portion provided on the one surface of the first semiconductor layer. Thus, a stress applied to the second semiconductor laser device by the projection provided on the one surface of the first semiconductor layer and a stress created in the projection are reduced. Consequently, the respective characteristics of the first and second semiconductor laser devices are prevented from being degraded by the stresses. As a result, the reliability of the semiconductor laser apparatus is improved.

The first semiconductor laser device and the second semiconductor laser device come into contact with each other in the raised portion provided on the one surface of the first semiconductor layer, so that the contact area between the first semiconductor laser device and the second semiconductor laser device is increased. This allows the first semiconductor laser device and the second semiconductor laser device to be joined to each other in a stable state. As a result, the assembling precision of the semiconductor laser apparatus is improved, so that the manufacturing yield thereof is improved.

The first semiconductor laser device and the second semiconductor laser device can be reliably joined to each other using a small amount of bonding material. This prevents a part of the bonding material from being detoured around the side surface of the first or second semiconductor layer. As a result, the first and second semiconductor laser devices are prevented from being short-circuited, so that the manufacturing yield is improved.

(8)

The projection, the first emission point, and the second emission point may be positioned along a direction substantially perpendicular to the one surface of the first semiconductor layer.

In this case, the first emission point and the second emission point are in close proximity to each other on a substantially straight line. This allows both the first emission point and the second emission point to be brought nearer the center of the package. As a result, a common optical system can be used for laser beams respectively emitted from the first emission point and the second emission point.

(9)

The first semiconductor laser device may comprise a first active layer and a first cladding layer in this order, the first cladding layer comprising a flat portion and a ridge on the flat portion, and the projection being formed so as to cover the first ridge, and the second semiconductor laser device may comprise a second active layer, a second cladding layer, and a current blocking layer having a striped opening in this order.

In this case, the first emission point is formed in a region of the first active layer below the projection, and the second emission point is formed in a region of the second active layer below the striped opening.

(10)

The raised portion may comprise raised portions provided apart from the projection on both sides thereof.

In this case, the contact area between the first semiconductor laser device and the second semiconductor laser device is further increased. This allows the first semiconductor laser device and the second semiconductor laser device to be joined to each other in a more stable state. As a result, the assembling precision of the semiconductor laser apparatus is further improved, so that the manufacturing yield thereof is further improved.

(11)

The spacing between said projection and said raised portion may be not less than 5 µm nor more than 150 µm.

The spacing between said projection and said raised portion is not less than 5 µm, so that a bonding material can be sufficiently accommodated between the projection and the raised portion. This reliably prevents the bonding material from being detoured around the side surface of the semiconductor laser device.

The spacing between said projection and said raised portion is not more than 150 µm, so that the contact area between the semiconductor laser devices can be sufficiently ensured. This allows the semiconductor laser devices to be joined to each other in a more stable state. As a result, the assembling precision of the semiconductor laser apparatus is further improved, so that the manufacturing yield thereof is further improved.

(12)

A semiconductor laser apparatus according to another aspect of the present invention comprises a first semiconductor laser device comprising a first semiconductor layer having a first emission point emitting a light beam having a first wavelength; a second semiconductor laser device comprising a second semiconductor layer having a second emission point emitting a light beam having a second wavelength; and a third semiconductor laser device comprising a third semiconductor layer having a third emission point emitting a light beam having a third wavelength, one surface of the second semiconductor layer being joined to a first region on one surface of the first semiconductor layer, and one surface of the third semiconductor layer is joined to a second region on the one surface of the first semiconductor layer, a striped first projection being provided on at least one of the first region and the one surface of the second semiconductor layer, a first raised portion being provided apart from the first projection on at least one of the first region and the one surface of the second semiconductor layer, a striped second projection being provided on at least one of the second region and the one surface of the third semiconductor layer, a second raised portion being provided apart from the second projection on at least one of the second region and the one surface of the third semiconductor layer, and the height of the first raised portion being not less than the height of the first projection, and the height of the second raised portion being not less than the height of the second projection.

In the semiconductor laser apparatus, the striped first projection is provided on at least one of the first region on the one surface of the first semiconductor layer in the first semiconductor laser device and the one surface of the second semiconductor layer in the second semiconductor laser device. The first raised portion is provided apart from the first projection on at least one of the first region and the one surface of the second semiconductor layer. Further, the striped second projection is provided on at least one of the second region on the one surface of the first semiconductor layer in the first semiconductor laser device and the one surface of the third semiconductor laser in the third semiconductor laser device. The second raised portion is provided apart from the second projection on at least one of the second region and the one surface of the third semiconductor layer. Here, the height of the first raised portion is not less than the height of the first projection, and the height of the second raised portion is not less than the height of the second projection. Further, the first region on the one surface of the first semiconductor layer and the one surface of the second semiconductor layer are joined to each other, and the second region on the one surface of the first semiconductor layer and the one surface of the third semiconductor layer are joined to each other.

In this case, the first region on the one surface of the first semiconductor layer in the first semiconductor laser device and the one surface of the second semiconductor layer in the second semiconductor laser device are joined to each other, so that the distance between the first emission point of the first semiconductor layer and the second emission point of the second semiconductor layer is reduced. This allows both the first emission point and the second emission point to be brought near the center of a package. As a result, a common optical system can be used for laser beams respectively emitted from the first emission point and the second emission point.

The third semiconductor laser device is mounted on the second region on the one surface of the first semiconductor layer in the first semiconductor laser device. The three semiconductor laser devices are thus provided so that the one semiconductor laser device can correspond to three optical recording media.

Since the height of the first raised portion is not less than the height of the first projection, the first semiconductor laser device and the second semiconductor laser device come into contact with each other in the first raised portion. Thus, a stress applied by the first projection provided on the one surface of one of the semiconductor laser devices to the one surface of the other semiconductor laser device and a stress created in the first projection are reduced. Consequently, the respective characteristics of the first and second semiconductor laser devices are prevented from being degraded by the stresses.

Since the height of the second raised portion is not less than the height of the second projection, the first semiconductor laser device and the third semiconductor laser device come into contact with each other in the second raised portion. Thus, a stress applied by the second projection provided on the one surface of one of the semiconductor laser devices to the one surface of the other semiconductor laser device and a stress created in the second projection are reduced. Consequently, the respective characteristics of the first and third semiconductor laser devices are prevented from being degraded by the stresses.

These results cause the reliability of the semiconductor laser apparatus to be improved.

The first semiconductor laser device and the second semiconductor laser device come into contact with each other in the first raised portion, so that the contact area between the first semiconductor laser device and the second semiconductor laser device is increased. This allows the first semiconductor laser device and the second semiconductor laser device to be joined to each other in a stable state. Further, the first semiconductor laser device and the third semiconductor laser device come into contact with each other in the second raised portion, so that the contact area between the first semiconductor laser device and the third semiconductor laser device is increased. This allows the first semiconductor laser device and the third semiconductor laser device to be joined to each other in a stable state. As a result, the assembling precision of the semiconductor laser apparatus is improved, so that the manufacturing yield thereof is improved.

The first semiconductor laser device and the second semiconductor laser device can be reliably joined to each other using a small amount of bonding material. The first semiconductor laser device and the third semiconductor laser device can be reliably joined to each other using a small amount of bonding material. The results prevent a part of the bonding material from being detoured around a side surface of the first, second, or third semiconductor layer. As a result, the first, second, and third semiconductor laser devices are prevented from being short-circuited, so that the manufacturing yield is improved.

(13)

The first raised portion may comprise first raised portions provided apart from the first projection on both sides thereof, and the second raised portion may comprise second raised portions provided apart from the second projection on both sides thereof.

In this case, the contact area between the first semiconductor laser device and the second semiconductor laser device and the contact area between the first semiconductor laser device and the third semiconductor laser device are further increased. This allows the second semiconductor laser device and the third semiconductor laser device to be joined to the first semiconductor laser device in a more stable state. As a result, the assembling precision of the semiconductor laser apparatus is further improved, so that the manufacturing yield thereof is further improved.

(14)

The spacing between said first projection and said first raised portion and the spacing between said second projection and said second raised portion may be not less than 5 µm nor more than 150 µm.

The spacing between said first projection and said first raised portion and the spacing between said second projection and said second raised portion are not less than 5 µm, so that a bonding material can be sufficiently accommodated between the projection and the raised portion. This reliably prevents the bonding material from being detoured around the side surface of the semiconductor laser device.

Furthermore, the spacing between said first projection and said first raised portion and the spacing between said second projection and said second raised portion are not more than 150 µm, so that the contact area between the semiconductor laser devices can be sufficiently ensured. This allows the semiconductor laser devices to be joined to each other in a more stable state. As a result, the assembling precision of the semiconductor laser apparatus is further improved, so that the manufacturing yield thereof is further improved.

(15)

A semiconductor laser apparatus according to still another aspect of the present invention comprises a first semiconductor laser device comprising a first semiconductor layer having a first emission point emitting a light beam having a first wavelength; a second semiconductor laser device comprising a second semiconductor layer having a second emission point emitting a light beam having a second wavelength; and a third semiconductor laser device comprising a third semiconductor layer having a third emission point emitting a light beam having a third wavelength, the second and third semiconductor laser devices being formed on a common substrate, one surface of the second semiconductor layer being joined to a first region on one surface of the first semiconductor layer, and one surface of the third semiconductor layer being joined to a second region on the one surface of the first semiconductor layer, a striped first projection being provided on at least one of the first region and the one surface of the second semiconductor layer, a first raised portion being provided apart from the first region on at least one side thereof on at least one of the first region and the one surface of the second semiconductor layer, a second raised portion being provided on at least one of the second region and the one surface of the third semiconductor layer, and the respective heights of the first and second raised portions being not less than the height of the first projection.

In the semiconductor laser apparatus, the striped first projection is provided on at least one of the first region on the one surface of the first semiconductor layer in the first semiconductor laser device and the one surface of the second semiconductor layer in the second semiconductor laser device. The first raised portions are provided apart from the first projection on both sides thereof on at least one of the first region and the one surface of the second semiconductor layer. Further, the second raised portion is provided on at least one of the second region on the one surface of the first semiconductor layer in the first semiconductor laser device and the one surface of the third semiconductor laser in the third semiconductor laser device. Here, the second and third semiconductor laser devices are formed on the common substrate, and the respective heights of the first and second raised portions are not less than the height of the first projection. Further, the first region on the one surface of the first semiconductor layer and the one surface of the second semiconductor layer are joined to each other, and the second region on the one surface of the first semiconductor layer and the one surface of the third semiconductor layer are joined to each other.

In this case, the first region on the one surface of the first semiconductor layer in the first semiconductor laser device and the one surface of the second semiconductor layer in the second semiconductor laser device are joined to each other, so that the distance between the first emission point of the first semiconductor layer and the second emission point of the second semiconductor layer is reduced. This allows both the first emission point and the second emission point to be brought near the center of the package. As a result, a common optical system can be used for laser beams respectively emitted from the first emission point and the second emission point.

The third semiconductor laser device is mounted on the second region on the one surface of the first semiconductor layer in the first semiconductor laser device. The three semiconductor laser devices are thus provided so that the one semiconductor laser device can correspond to three optical recording media.

Since the respective heights of the first and second raised portions are not less than the height of the first projection, the first semiconductor laser device comes into contact with the second semiconductor laser device in the first raised portion, while coming into contact with the third semiconductor laser device in the second raised portion. Thus, a stress applied by the first projection provided on the one surface of one of the first and second semiconductor laser devices to the one surface of the other semiconductor laser device and a stress created in the first projection are reduced. Consequently, the respective characteristics of the first and second semiconductor laser devices are prevented from being degraded by the stresses. As a result, the reliability of the semiconductor laser apparatus is improved.

The first semiconductor laser device comes into contact with the second and third semiconductor laser devices in the first and second raised portions, so that the respective contact areas between the first semiconductor laser device and the second and third semiconductor laser devices are increased. This allows the first semiconductor laser device and the second and third semiconductor laser devices to be respectively joined to each other in a stable state. As a result, the assembling precision of the semiconductor laser apparatus is improved, so that the manufacturing yield thereof is improved.

The first semiconductor laser device and the second and third semiconductor laser devices can be reliably joined to each other using a small amount of bonding material. This prevents a part of the bonding material from being detoured around a side surface of the first, second, or third semiconductor layer. As a result, the first, second, and third semiconductor laser devices are prevented from being short-circuited, so that the manufacturing yield is improved.

(16)

A striped second projection may be provided on the one surface of the third semiconductor layer, a second raised portion may be provided apart from the second projection on at least one side thereof on at least one of the second region and the one surface of the third semiconductor layer, and the height of the second raised portion may be not less than the height of the second projection.

In this case, the height of the second raised portion is not less than the height of the second projection, so that the first semiconductor laser device and the third semiconductor laser device come into contact with each other in the second raised portion. Thus, a stress applied to the one surface of the first semiconductor laser device by the second projection and a stress created in the second projection are reduced. Consequently, the respective characteristics of the first and third semiconductor laser devices are prevented from being degraded by the stresses. As a result, the reliability of the semiconductor laser apparatus is improved.

(17)

The spacing between said first projection and said first raised portion may be not less than 5 μm nor more than 150 μm.

The spacing between said first projection and said first raised portion is not less than 5 μm, so that the bonding material can be sufficiently accommodated between the projection and the raised portion. This reliably prevents the bonding material from being detoured around the side surface of the semiconductor laser device.

Furthermore, the spacing between said first projection and said first raised portion is not more than 150 μm, so that the contact area between the semiconductor laser devices can be sufficiently ensured. This allows the semiconductor laser devices to be joined to each other in a more stable state. As a result, the assembling precision of the semiconductor laser apparatus is further improved, so that the manufacturing yield thereof is further improved.

Other features, elements, characteristics, and advantages of the present invention will become more apparent from the following description of preferred embodiments of the present invention with reference to the attached drawings.

BRIEF DESCRIPTION OF THE DRAWINGS

FIG. 5 is a schematic sectional view showing an example of a semiconductor laser apparatus according to a second embodiment;

DESCRIPTION OF THE PREFERRED EMBODIMENTS

Semiconductor laser apparatuses according to the present embodiments will be described.

First Embodiment

Figure 1:
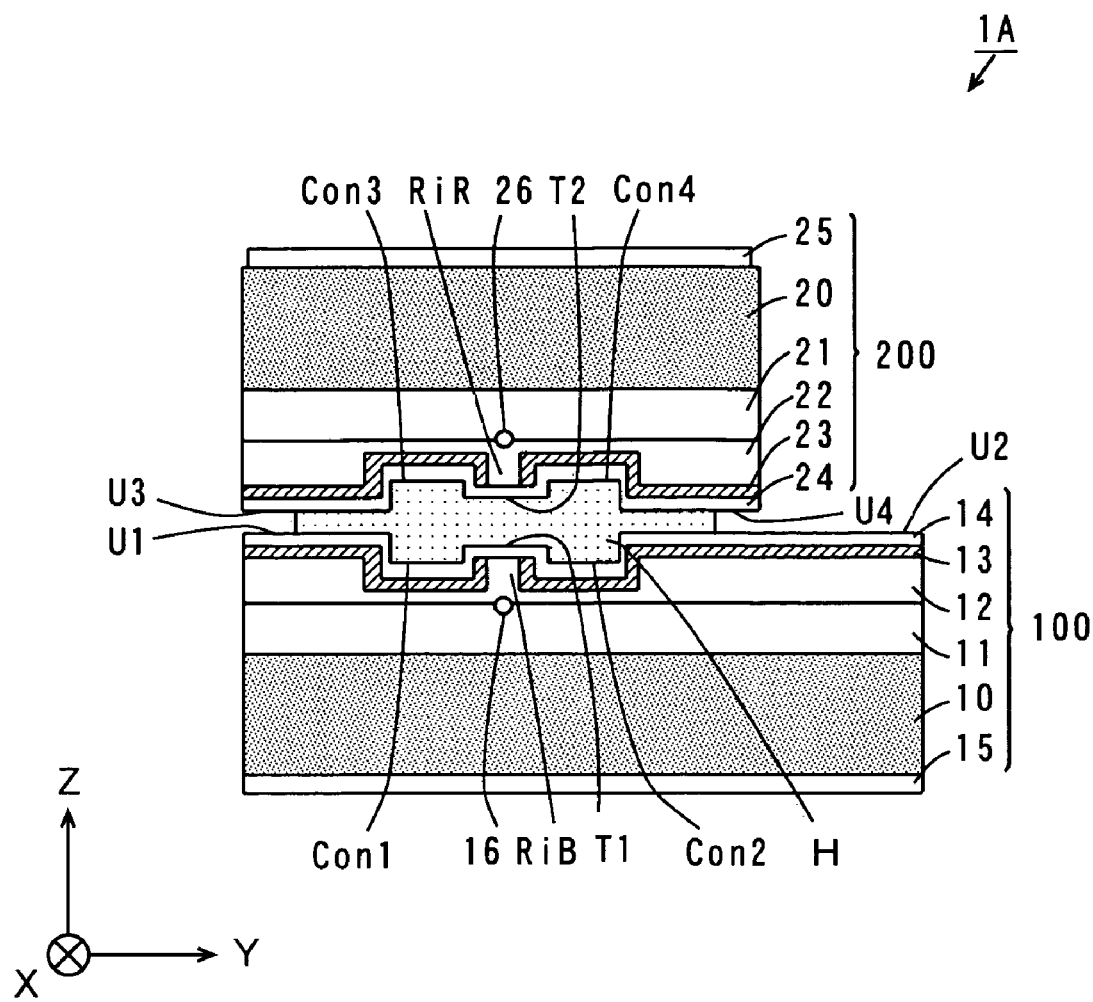
FIG. 1 is a schematic sectional view showing an example of a semiconductor laser apparatus according to a first embodiment.

FIG. 1 is a schematic sectional view showing an example of a semiconductor laser apparatus according to a first embodiment.

In the following description, two directions perpendicular to each other within a horizontal surface are defined as an X-direction and a Y-direction, and a direction perpendicular to the X-direction and the Y-direction is defined as a Z-direction, as indicated by arrows shown in FIG. 1. In drawings subsequent to FIG. 1, an X-direction, a Y-direction, and a Z-direction are also defined, as described above.

The X-direction and the Y-direction are directions respectively parallel to a p-n junction interface of a blue-violet semiconductor laser device and a red semiconductor laser device, described later. The Z-direction is a direction perpendicular to the p-n junction interfacee of the blue-violet semiconductor laser device and the red semiconductor laser device.

A semiconductor laser apparatus 1A according to the present embodiment comprises a blue-violet semiconductor laser device 100 emitting a laser beam having a wavelength of approximately 405 nm and a red semiconductor laser device 200 emitting a laser beam having a wavelength of approximately 650 nm.

As shown in FIG. 1, the blue-violet semiconductor laser device 100 has an n-type semiconductor layer 11 and a p-type semiconductor laser 12 on an upper surface of an n-GaN substrate 10. A ridge RiB extending in the X-direction is formed in the p-type semiconductor layer 12. Raised portions are formed a predetermined distance apart from the ridge RiB on both sides thereof. Thus, a pair of recesses is formed between the ridge RiB and the raised portions.

An insulating layer 13 is formed in a region excluding an upper surface of the ridge RiB on an upper surface of the p-type semiconductor layer 12. Further, a p-side pad electrode 14 is formed so as to cover the insulating layer 13 and the upper surface of the ridge RiB. Thus, a striped projection T1 corresponding to the ridge RiB and a pair of raised portions U1 and U2 are formed on an upper surface of the blue-violet semiconductor laser device 100. Recesses Con1 and Con2 are respectively formed between the projection T1 and the pair of raised portions U1 and U2. An n-electrode 15 is formed on a lower surface of the n-GaN substrate 10.

The red semiconductor laser device 200 has an n-type semiconductor layer 21 and a p-type semiconductor layer 22 on a lower surface of an n-GaAs substrate 20. A ridge RiR extending in the X-direction is formed in the p-type semiconductor layer 22. Raised portions are formed a predetermined distance apart from the ridge RiR on both sides thereof. Thus, a pair of recesses is formed between the ridge RiR and the raised portions.

An insulating layer 23 is formed in a region excluding a lower surface of the ridge RiR on a lower surface of the p-type semiconductor layer 22. Further, a p-side pad electrode 24 is formed so as to cover the insulating layer 23 and the lower surface of the ridge RiR. Thus, a striped projection T2 corresponding to the ridge RiR and a pair of raised portions U3 and U4 are formed on a lower surface of the red semiconductor laser device 200. Recesses Con3 and Con4 are respectively formed between the projection T2 and the pair of raised portions U3 and U4. An n-electrode 25 is formed on an upper surface of the n-GaAs substrate 20.

The blue-violet semiconductor laser device 100 and the red semiconductor laser device 200 are joined to each other with a solder H such that the projection T1 and the projection T2 are opposed to each other. Thus, the p-side pad electrode 14 in the blue-violet semiconductor laser device 100 and the p-side pad electrode 24 in the red semiconductor laser device 200 are electrically connected to each other.

The blue-violet semiconductor laser device 100 has a larger width in the Y-direction, as compared with the red semiconductor laser device 200. Thus, a part of the p-side pad electrode 14 is exposed when the blue-violet semiconductor laser device 100 and the red semiconductor laser device 200 are joined to each other. A wire 1W, described later, is connected to an exposed region of the p-side pad electrode 14.

A voltage is applied between the p-side pad electrode 14 and the n-electrode 15 in the blue-violet semiconductor laser device 100 so that the laser beam having the wavelength of approximately 405 nm is emitted in the X-direction from a region (hereinafter referred to as a blue-violet emission point) 16 below the ridge RiB on a junction interface of the n-type semiconductor layer 11 and the p-type semiconductor layer 12.

A voltage is applied between the p-side pad electrode 24 and the n-electrode 25 in the red semiconductor laser device 200 so that the laser beam having the wavelength of approximately 650 nm is emitted in the X-direction from a region (hereinafter referred to as a red emission point) 26 above the ridge RiR on a junction interface of the n-type semiconductor layer 21 and the p-type semiconductor layer 22.

Figure 2:
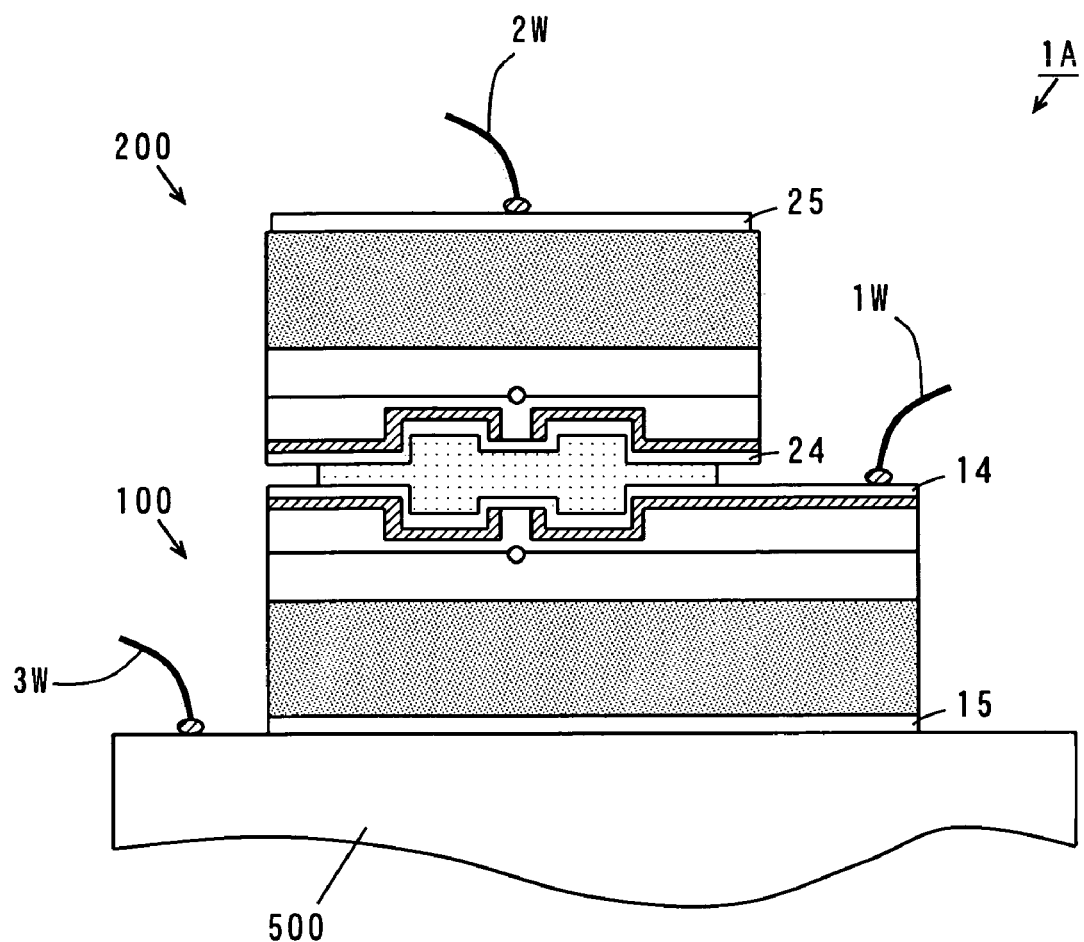
FIG. 2 is a schematic sectional view showing a state where the semiconductor laser apparatus shown in FIG. 1 is joined to a sub-mount.

FIG. 2 is a schematic sectional view showing a state where the semiconductor laser apparatus 1A shown in FIG. 1 is joined to a sub-mount. In a case where the semiconductor laser apparatus 1A shown in FIG. 1 is mounted within a package, the semiconductor laser apparatus 1A is mounted on a sub-mount 500 composed of a metal such as Cu, CuW, or Al, as shown in FIG. 2. The p-side pad electrodes 14 and 24 and the n-electrodes 15 and 25 are wired using wires 11W, 2W, and 3W.

The p-side pad electrode 14 in the blue-violet semiconductor laser device 100 is connected to a first power feed pin (not shown) provided within the package by the wire 1W. The n-electrode 25 in the red semiconductor laser device 200 is connected to a second power feed pin (not shown) provided within the package by the wire 2W.

The n-electrode 15 in the blue-violet semiconductor laser device 100 is wired by joining the n-electrode 15 to a surface of the sub-mount 500. Thus, the n-electrode 15 and the surface of the sub-mount 500 are electrically connected to each other. The sub-mount 500 is connected to a third power feed pin (not shown) provided within the package by the wire 3W.

The blue-violet semiconductor laser device 100 can be driven by applying a voltage between the wire 1W and the wire 3W through the first power feed pin and the third power feed pin, and the red semiconductor laser device 200 can be driven by applying a voltage between the wire 1W and the wire 2W through the first power feed pin and the second power feed pin. Thus, the blue-violet semiconductor laser device 100 and the red semiconductor laser device 200 can be respectively independently driven.

The respective configurations of the blue-violet semiconductor laser device 100 and the red semiconductor laser device 200 will be further described in detail below.

Figure 3:
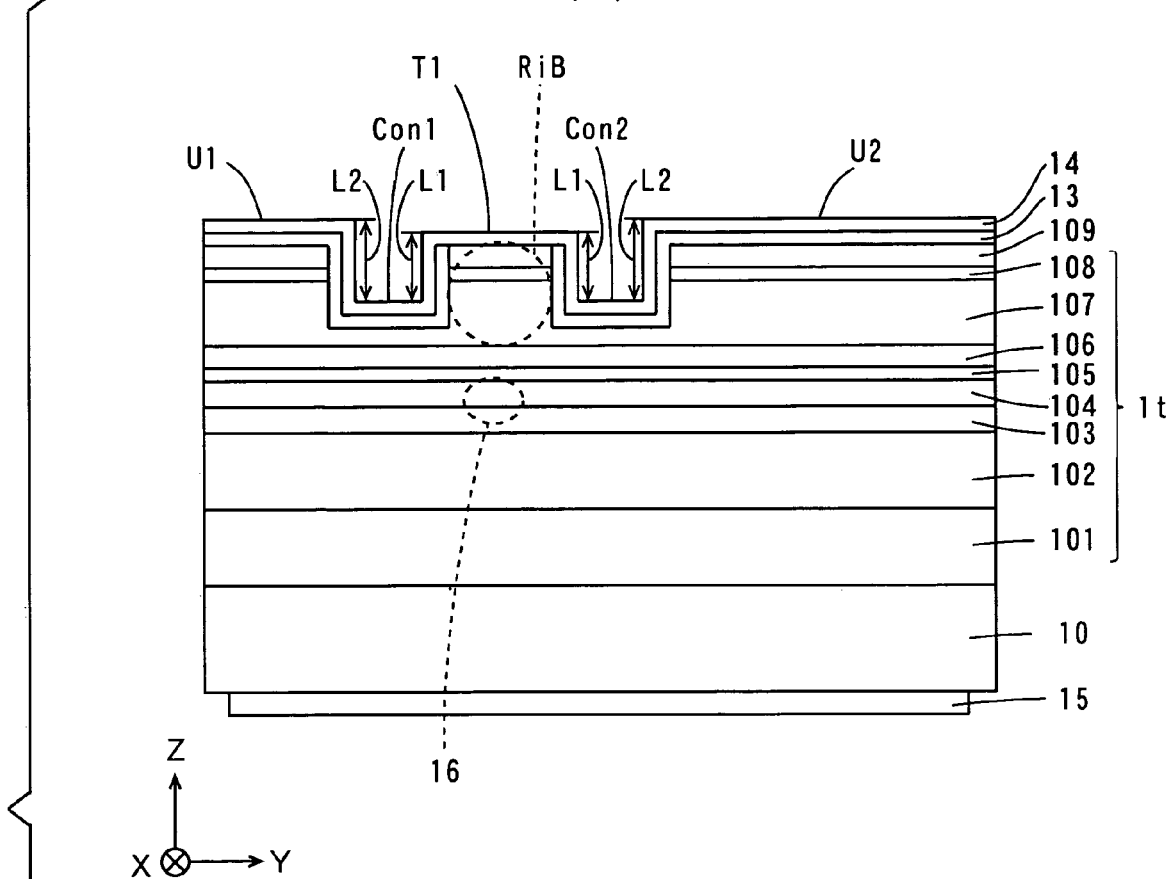
FIG. 3 is a schematic sectional view showing the details of a blue-violet semiconductor laser device.
Figure 3:
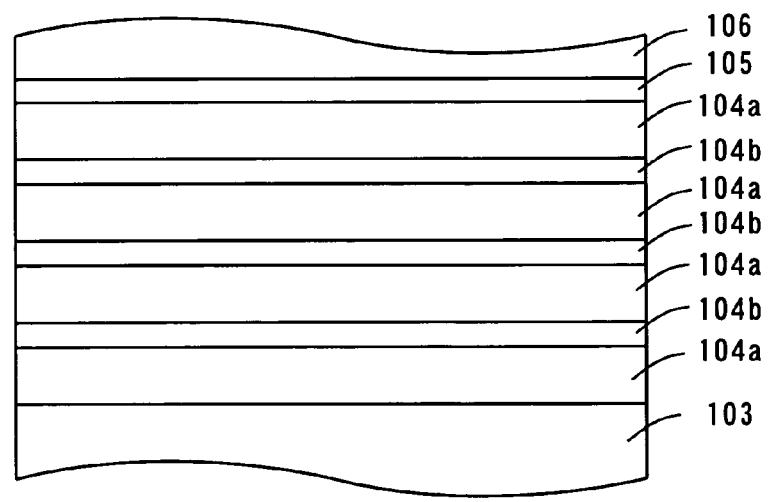

FIG. 3 is a schematic sectional view showing the details of the blue-violet semiconductor laser device 100.

When the blue-violet semiconductor laser device 100 is manufactured, a semiconductor layer 1t in which the n-type semiconductor layer 11 and the p-type semiconductor layer 12 are stacked on the n-GaN substrate 10, as described above, is formed.

As shown in FIG. 3(a), an n-GaN layer 101, an n-AlGaN cladding layer 102, an n-GaN optical guide layer 103, a multi-quantum well (MQW) active layer 104, an undoped AlGaN cap layer 105, an undoped GaN optical guide layer 106, a p-AlGaN cladding layer 107, and an undoped GaInN contact layer 108 are formed in this order as the semiconductor layer 1t on the one surface of the n-GaN substrate 10. The layers are formed by metal organic chemical vapor deposition (MOCVD), for example. Further, an electrode layer 109 composed of Pd/Pt/Au is formed on the undoped GaInN contact layer 108.

As shown in FIG. 3(b), the MQW active layer 104 has a structure in which four undoped GaInN barrier layers 104a and three undoped GaInN well layers 104b are alternately stacked.

Here, the Al composition of the n-AlGaN cladding layer 102 is 0.15, and the Ga composition thereof is 0.85, for example. Si is doped into the n-GaN layer 101, the n-AlGaN cladding layer 102, and the n-GaN optical guide layer 103.

The Ga composition of the undoped GaInN barrier layer 104a is 0.95, and the In composition thereof is 0.05. The Ga composition of the undoped GaInN well layer 104b is 0.90, and the In composition thereof is 0.10. The Al composition of the p-AlGaN cap layer 105 is 0.30, and the Ga composition thereof is 0.70.

Furthermore, the Al composition of the p-AlGaN cladding layer 107 is 0.15, and the Ga composition thereof is 0.85. Mg is doped into the p-AlGaN cladding layer 107. The Ga composition of the undoped GaInN contact layer 108 is 0.95, and the In composition thereof is 0.05.

A pair of striped recesses extending in the X-direction with predetermined spacing is formed in the p-AlGaN cladding layer 107, the undoped GaInN contact layer 108, and the electrode layer 109. Thus, a ridge RiB extending in the X-direction is formed between the recesses. The ridge RiB has a width of approximately 1.5 μm. Further, raised portions are respectively formed in regions outside the pair of recesses.

An insulating layer 13 is formed so as to cover a side surface and a bottom surface of each of the recesses and an upper surface of each of the raised portions. Further, a p-side pad electrode 14 is formed so as to cover the insulating layer 13 and the upper surface of the ridge RiB. Thus, a striped projection T1 corresponding to the ridge RiB and a pair of raised portions U1 and U2 are formed on an upper surface of the blue-violet semiconductor laser device 100. Recesses Con1 and Con2 are respectively formed between the projection T1 and the raised portions U1 and U2. Further, an n-electrode 15 composed of Ti/Pt/Au is formed on the other surface of the n-GaN substrate 10.

Since the insulating layer 13 is not formed on the ridge RiB, the height L1 of the projection T1 becomes smaller by the thickness of the insulating layer 13, as compared with the height L2 of the raised portions U1 and U2.

In the blue-violet semiconductor laser device 100, a blue-violet emission point 16 is formed at a position of the MQW active layer 104 below the ridge RiB.

Figure 4:
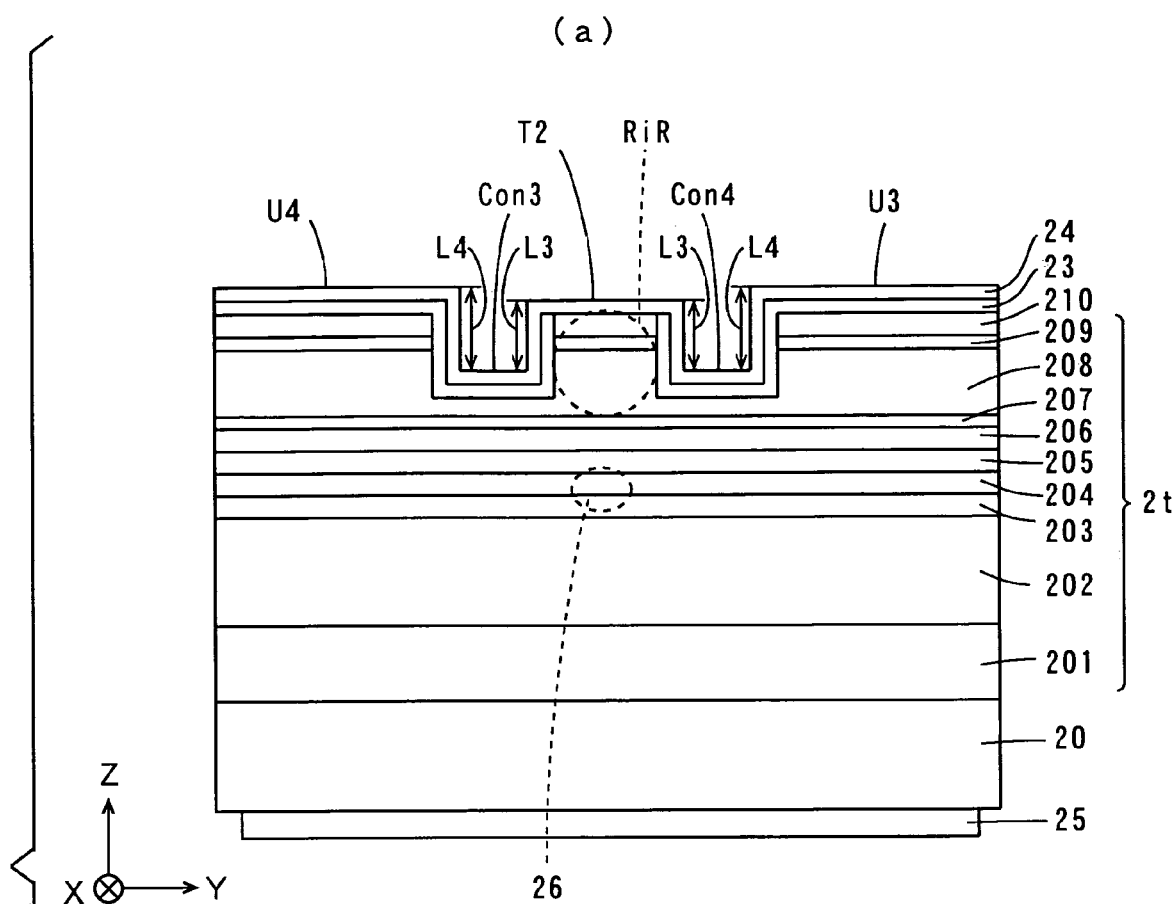
FIG. 4 is a schematic sectional view showing the details of a red semiconductor laser device.
Figure 4:
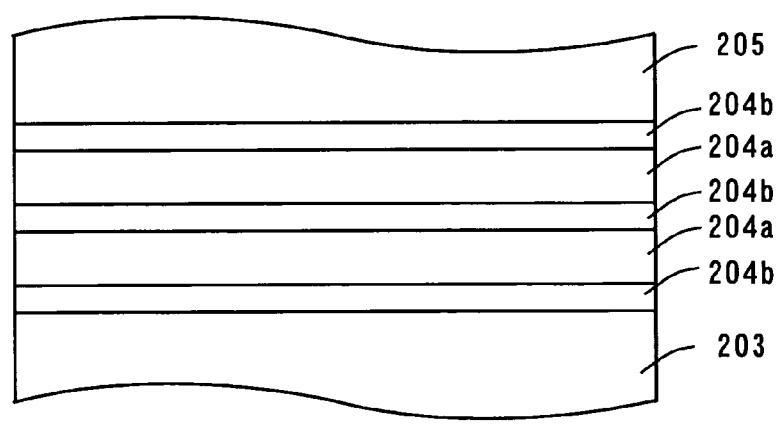

FIG. 4 is a schematic sectional view showing the details of the red semiconductor laser device 200.

When the red semiconductor laser device 200 is manufactured, a semiconductor layer 2t in which the n-type semiconductor layer 21 and the p-type semiconductor layer 22 are stacked on the n-GaAs substrate 20, as described above, is formed. Si is doped into the n-GaAs substrate 20.

As shown in FIG. 4(a), an n-GaAs layer 201, an n-AlGaInP cladding layer 202, an undoped AlGaInP optical guide layer 203, an MQW active layer 204, an undoped AlGaInP optical guide layer 205, a p-AlGaInP first cladding layer 206, a p-InGaP etching stop layer 207, a p-AlGaInP second cladding layer 208, and a p-contact layer 209 are formed in this order as the semiconductor layer 2t on the one surface of the n-GaAs substrate 20. The layers are formed by MOCVD, for example. Further, an electrode layer 210 composed of Cr/Au is formed on the p-contact layer 209.

As shown in FIG. 4(b), the MQW active layer 204 has a structure in which two undoped AlGaInP barrier layers 204a and three undoped InGaP well layers 204b are alternately stacked.

Here, the Al composition of the n-AlGaInP cladding layer 202 is 0.35, the Ga composition thereof is 0.15, and the In composition thereof is 0.50, for example. Si is doped into the n-GaAs layer 201 and the n-AlGaInP cladding layer 202.

The Al composition of the undoped AlGaInP optical guide layer 203 is 0.25, the Ga composition thereof is 0.25, and the In composition thereof is 0.50.

The Al composition of the undoped AlGaInP barrier layer 204a is 0.25, the Ga composition thereof is 0.25, and the In composition thereof is 0.50. The In composition of the undoped InGaP well layer 204b is 0.50, and the Ga composition thereof is 0.50. The Al composition of the undoped AlGaInP optical guide layer 205 is 0.25, the Ga composition thereof is 0.25, and the In composition thereof is 0.50.

Furthermore, the Al composition of the p-AlGaInP first cladding layer 206 is 0.35, the Ga composition thereof is 0.15, and the In composition thereof is 0.50. The In composition of the p-InGaP etching stop layer 207 is 0.50, and the Ga composition thereof is 0.50.

The Al composition of the p-AlGaInP second cladding layer 208 is 0.35, the Ga composition thereof is 0.15, and the In composition thereof is 0.50.

The p-contact layer 209 has a multilayer structure of a p-GaInP layer and a p-GaAs layer. The Ga composition of the p-GaInP layer is 0.50, and the In composition thereof is 0.50.

When the composition of the AlGaInP based material is expressed by a general formula $Al_aGa_bIn_cP$, where a indicates the Al composition, b indicates the Ga composition, and c indicates the In composition.

Zn is doped into the p-AlGaInP first cladding layer 206, the p-InGaP etching stop layer 207, the p-AlGaInP second cladding layer 208, and p-GaInP and p-GaAs in the p-contact layer 209.

A pair of striped recesses extending in the X-direction with predetermined spacing is formed in the p-AlGaInP second cladding layer 208, the p-contact layer 209, and the electrode layer 210. Thus, a ridge RiR extending in the X-direction is formed between the recesses. The ridge RiR has a width of approximately 2.5 µm. Further, raised portions are respectively formed in regions outside the pair of recesses.

An insulating layer 23 is formed so as to cover a side surface and a bottom surface of each of the recesses and an upper surface of each of the raised portions. Further, a p-side pad electrode 24 is formed so as to cover the insulating layer 23 and an upper surface of the ridge RiR. Thus, a striped projection T2 corresponding to the ridge RiR and a pair of raised portions U3 and U4 are formed on an upper surface of the red semiconductor laser device 200. Recesses Con3 and Con4 are respectively formed between the projection T2 and the pair of raised portions U3 and U4. An n-electrode 25 composed of AuGe/Ni/Au is formed on the other surface of the n-GaAs substrate 20.

Since the insulating layer 23 is not formed on the ridge RiR, the height L3 of the projection T2 becomes smaller by the thickness of the insulating layer 23, as compared with the height L4 of the raised portions U3 and U4.

In the red semiconductor laser device 200, a red emission point 26 is formed at a position of the MQW active layer 204 below the ridge RiR.

As described in the foregoing, in the present embodiment, the blue-violet semiconductor laser device 100 and the red semiconductor laser device 200 are joined to each other such that the projection T1 and the projection T2 are opposed to each other. In this case, the distance between the blue-violet emission point 16 in the blue-violet semiconductor laser device 100 and the red emission point 26 in the red semiconductor laser device 200 can be shortened. This allows both the blue-violet emission point 16 and the red emission point 26 to be brought near the center of the package. As a result, a common optical system can be used for laser beams respectively emitted from the blue-violet emission point 16 and the red emission point 26.

The height L1 of the projection T1 in the blue-violet semiconductor laser device 100 is smaller than the height L2 of the raised portions U1 and U2, and the height L3 of the projection T2 in the red semiconductor laser device 200 is smaller than the height L4 of the raised portions U3 and U4.

In this case, even if the blue-violet semiconductor laser device 100 and the red semiconductor laser device 200 are joined to each other such that the projection T1 and the projection T2 are opposed to each other, the raised portions U1 and U2 and the raised portions U3 and U4 come into contact with each other, which can prevent the projections T1 and T2 from coming into contact with each other. Thus, stresses respectively applied to the ridges RiB and RiR can be reduced, so that the characteristics can be prevented from being degraded by the stresses. As a result, the reliability of the semiconductor laser apparatus 1A is improved.

The raised portions U1 and U2 and the raised portions U3 and U4 come into contact with each other so that the contact area between the blue-violet semiconductor laser device 100 and the red semiconductor laser device 200 can be increased. This allows the red semiconductor laser device 200 to be joined to the blue-violet semiconductor laser device 100 in a stable state. As a result, the assembling precision of the semiconductor laser apparatus 1A can be improved.

The contact area between the blue-violet semiconductor laser device 100 and the red semiconductor laser device 200 is increased, so that the blue-violet semiconductor laser device 100 and the red semiconductor laser device 200 can be reliably joined to each other with a small amount of solder H. This can prevent a part of the solder H from being detoured around a side surface of the blue-violet semiconductor laser device 100. As a result, the semiconductor laser apparatus 1A can be prevented from being short-circuited.

Furthermore, a part of the melted solder H can be prevented from flowing out into a portion, to which the wire 11 is connected, on the p-side pad electrode 14 in the blue-violet semiconductor laser device 100. This can prevent defective contact of the wire 1W.

The recesses Con1, Con2, Con3, and Con4 serve to accommodate the solder H, so that the solder H can be reliably prevented from flowing out into the side surface of the blue-violet semiconductor laser device 100 and the portion, to which the wire 1W is connected, on the p-side pad electrode 14. This can prevent short-circuit of the semiconductor laser apparatus 1A and defective contact of the wire 1W.

These results allow the manufacturing yield of the semiconductor laser apparatus 1A to be improved.

As a result of the foregoing, it is possible to shorten the distance between the respective emission points of the laser beams as well as to improve the reliability and the manufacturing yield of the semiconductor laser apparatus 1A.

It is preferable that the respective widths in the Y-direction of the recesses Con1, Con2, Con3, and Con4 are not less than 5 μm. In this case, the solder H can be sufficiently accommodated in the recesses Con1, Con2, Con3, and Con4.

The difference in effective refractive index between regions of the MQW active layer 104 below the recesses Con1 and Con2 and a region of the MQW active layer 104 below the ridge RiB and the difference in effective refractive index between regions of the MQW active layer 204 below the recesses Con3 and Con4 and a region of the MQW active layer 204 below the ridge RiR can be ensured, which allows the effect of light confinement into the regions below the ridges RiB and RiR to be reliably obtained.

Furthermore, the insulating layers 13 and 23 and the p-side pad electrodes 14 and 24 can be reliably formed.

It is more preferable that the respective widths in the Y-direction of the recesses Con1, Con2, Con3, and Con4 are not less than 10 μm. In this case, the solder H can be reliably accommodated in the recesses Con1, Con2, Con3, and Con4. The effect of light confinement into the regions below the ridges RiB and RiR can be improved. Further, the insulating layers 13 and 23 and the p-side pad electrodes 14 and 24 can be more reliably formed.

It is preferable that the respective widths in the Y-direction of the recesses Con1, Con2, Con3, and Con4 are not more than one-fourth the width in the Y-direction of the red semiconductor laser device 200. In this case, the contact area between the blue-violet semiconductor laser device 100 and the red semiconductor laser device 200 can be sufficiently ensured.

It is more preferable that the respective widths in the Y-direction of the recesses Con1, Con2, Con3, and Con4 are not more than 150 μm. In this case, the contact area between the blue-violet semiconductor laser device 100 and the red semiconductor laser device 200 can be sufficiently increased.

It is more preferable that the respective widths in the Y-direction of the recesses Con1, Con2, Con3, and Con4 are not more than 30 μm. In this case, the contact area between the blue-violet semiconductor laser device 100 and the red semiconductor laser device 200 can be further increased.

Although the recesses Con1, Con2, Con3, and Con4 are illustrated so as to have the same width in FIGS. 1 to 4, the recesses Con1, Con2, Con3, and Con4 may respectively have different widths.

Although in the above-mentioned embodiment, the red semiconductor laser device 200 is joined to the top of the blue-violet semiconductor laser device 100, the blue-violet semiconductor laser device 100 may be joined to the top of the red semiconductor laser device 200. An infrared semiconductor laser device 300, described later, may be joined to the top of the blue-violet semiconductor laser device 100 in place of the red semiconductor laser device 200.

Although in the above-mentioned embodiment, each of the blue-violet semiconductor laser device 100 and the red semiconductor laser device 200 is provided with raised portions, either one of the blue-violet semiconductor laser device 100 and the red semiconductor laser device 200 may be also provided with the raised portions. In this case, the projection T1 and the projection T2 can be prevented from coming into contact with each other by making the respective heights of the raised portions larger than the total height of the projections T1 and T2.

Second Embodiment

A semiconductor laser apparatus according to a second embodiment differs from the semiconductor laser apparatus 1A according to the first embodiment except for the following points.

FIG. 5 is a schematic sectional view showing an example of the semiconductor laser apparatus according to the second embodiment.

In the semiconductor laser apparatus 1B according to the present embodiment, a red semiconductor laser device 200a has a p-type semiconductor layer 22a on a lower surface of an n-type semiconductor layer 21, as shown in FIG. 5. A striped ridge RiR1 extending in the X-direction is formed at the center on a lower surface of the p-type semiconductor layer 22a.

An insulating layer 23a is formed at the same height as the ridge RiR1 in a region excluding a lower surface of the ridge RiR1 on a lower surface of the p-type semiconductor layer 22a. Further, a p-side pad electrode 24a is formed on the lower surface of the ridge RiR1 and a lower surface of the insulating layer 23a.

A voltage is applied between the p-side pad electrode 24a and an n-electrode 25 in the red semiconductor laser device 200a so that a laser beam having a wavelength of approximately 650 nm is emitted in the X-direction from a region (hereinafter referred to as a red emission point) 26a above the ridge RiR1 on a junction interface of the n-type semiconductor layer 21 and the p-type semiconductor layer 22a.

A blue-violet semiconductor laser device 100 and the red semiconductor laser device 200a are joined to each other with a solder H such that a projection T1 and the ridge RiR1 are opposed to each other. In this case, the distance between a blue-violet emission point 16 in the blue-violet semiconductor laser device 100 and the red emission point 26a in the red semiconductor laser device 200a can be shortened. This allows both the blue-violet emission point 16 and the red emission point 26a to be brought near the center of a package. As a result, a common optical system can be used for laser beams respectively emitted from the blue-violet emission point 16 and the red emission point 26a.

The height L1 of the projection T1 in the blue-violet semiconductor laser device 100 is smaller than the height L2 of raised portions U1 and U2, and the p-side pad electrode 24a in the red semiconductor laser device 200a is not formed with irregularities.

In this case, even if the blue-violet semiconductor laser device 100 and the red semiconductor laser device 200a are joined to each other such that the projection T1 and the ridge RiR1 are opposed to each other, the raised portions U1 and U2 in the blue-violet semiconductor laser device 100 come into contact with the p-side pad electrode 24a in the red semiconductor laser device 200a, which prevents the projection T1 from coming into contact with the p-side pad electrode 24a. Thus, a stress applied to a ridge RiB can be reduced, so that the characteristics can be prevented from being degraded by the stress. As a result, the reliability of the semiconductor laser apparatus 1B is improved.

The raised portions U1 and U2 come into contact with the p-side pad electrode 24a so that the contact area between the blue-violet semiconductor laser device 100 and the red semiconductor laser device 200a can be increased. This allows the red semiconductor laser device 200a to be joined to the blue-violet semiconductor laser device 100 in a stable state. As a result, the assembling precision of the semiconductor laser apparatus 1B can be improved.

The contact area between the blue-violet semiconductor laser device 100 and the red semiconductor laser device 200a is increased, so that the blue-violet semiconductor laser device 100 and the red semiconductor laser device 200a can be reliably joined to each other with a small amount of solder H. This can prevent a part of the solder H from being detoured around a side surface of the blue-violet semiconductor laser device 100. As a result, the semiconductor laser apparatus 1B can be prevented from being short-circuited.

Furthermore, a part of the melted solder H can be prevented from flowing out into a portion, to which the wire 1W is connected, on a p-side pad electrode 14 in the blue-violet semiconductor laser device 100. This can prevent defective contact of the wire 1W.

The recesses Con1 and Con2 serve to accommodate the solder H, so that the solder H can be prevented from flowing out into the side surface of the blue-violet semiconductor laser device 100 and the portion, to which the wire 1W is connected, on the p-side pad electrode 14. This can prevent short-circuit of the semiconductor laser apparatus 1B and defective contact of the wire 1W.

These results allow the manufacturing yield of the semiconductor laser apparatus 1B to be improved.

As a result of the foregoing, it is possible to shorten the distance between the respective emission points of the laser beams as well as to improve the reliability and the manufacturing yield of the semiconductor laser apparatus 1B.

Although in the above-mentioned embodiment, the blue-violet semiconductor laser device 100 is provided with the recesses Con1 and Con2, the blue-violet semiconductor laser device 100 may not be provided with the recesses Con1 and Con2 in a case where the red semiconductor laser device 200a is replaced with the red semiconductor laser device 200 shown in FIG. 1.

Third Embodiment

A semiconductor laser apparatus according to a third embodiment differs from the semiconductor laser apparatus 1A according to the first embodiment except for the following points.

Figure 6:
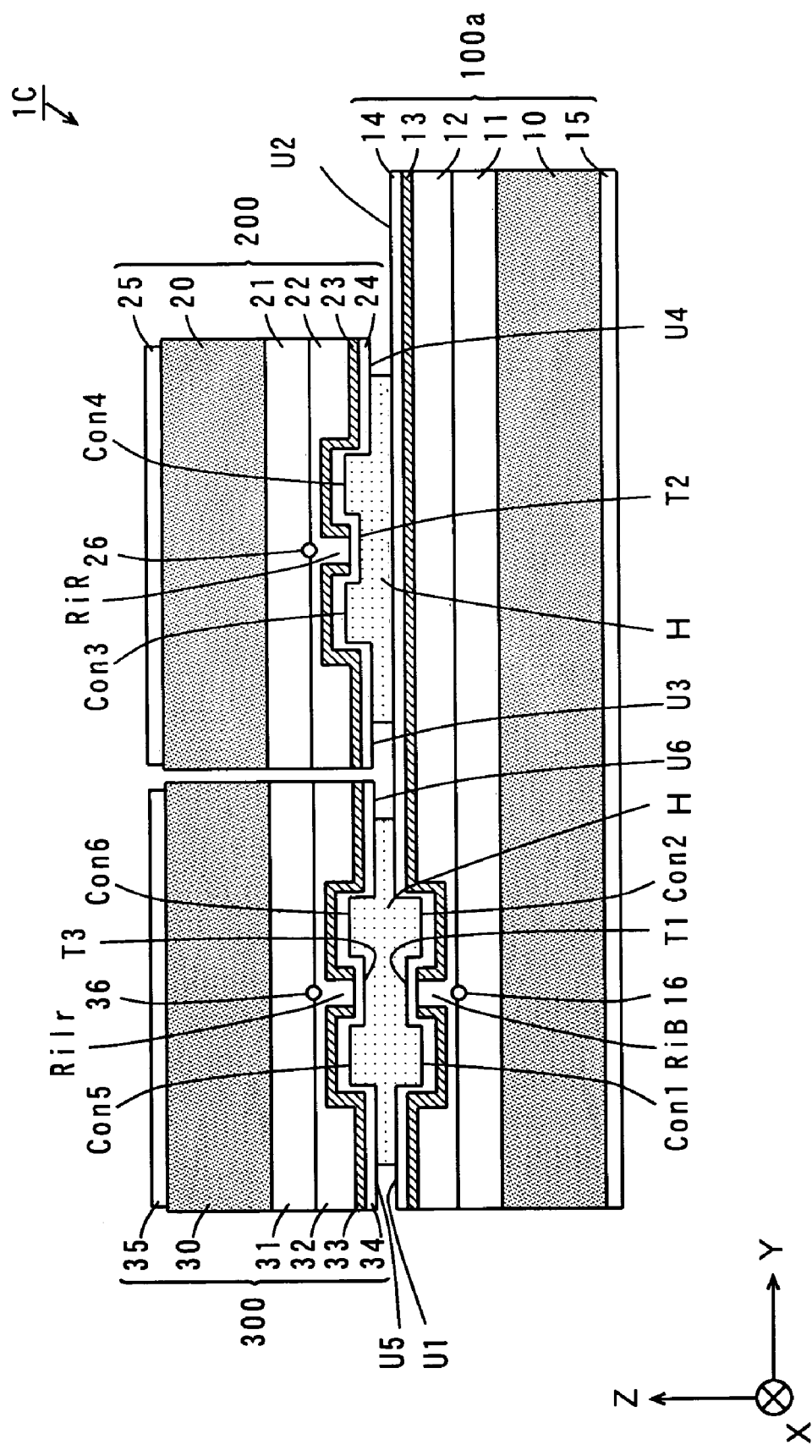
FIG. 6 is a schematic sectional view showing an example of a semiconductor laser apparatus according to a third embodiment.

FIG. 6 is a schematic sectional view showing an example of the semiconductor laser apparatus according to the third embodiment.

The semiconductor laser apparatus 1C according to the present embodiment comprises a blue-violet semiconductor laser device 100a emitting a laser beam having a wavelength of approximately 405 nm, a red semiconductor laser device 200 emitting a laser beam having a wavelength of approximately 650 nm (see FIGS. 1 and 4), and an infrared semiconductor laser device 300 emitting a laser beam having a wavelength of approximately 780 nm.

As shown in FIG. 6, the blue-violet semiconductor laser device 100a has a configuration in which a portion (a raised portion U2) outside of the recess Con2 in the blue-violet semiconductor laser device 100 shown in FIG. 1 is increased by a predetermined width in the Y-direction.

The infrared semiconductor laser device 300 has an n-type semiconductor layer 31 and a p-type semiconductor layer 32 on a lower surface of an n-GaAs substrate 30. A ridge RiIr extending in the X-direction is formed in the p-type semiconductor layer 32. Raised portions are formed a predetermined distance apart from the ridge RiIr on both sides thereof. Thus, a pair of recesses is formed between the ridge RiIr and the raised portions.

An insulating layer 33 is formed in a region excluding a lower surface of the ridge RiIr on a lower surface of the p-type semiconductor layer 32. Further, a p-side pad electrode 34 is formed so as to cover the insulating layer 33 and the lower surface of the ridge RiIr. Thus, a striped projection T3 and a pair of raised portions U5 and U6 corresponding to the ridge RiIr are formed on a lower surface of the infrared semiconductor laser device 300. Recesses Con5 and Con6 are respectively formed between the projection T3 and the pair of raised portions U5 and U6. An n-electrode 35 is formed on an upper surface of the n-GaAs substrate 30.

The blue-violet semiconductor laser device 100a and the infrared semiconductor laser device 300 are joined to each other with a solder H such that a projection T1 and the projection T3 are opposed to each other. The red semiconductor laser device 200 is joined to a raised portion U2 with a solder H parallel to the infrared semiconductor laser device 300 with a raised portion T2 positioned on its lower side.

Thus, the p-side pad electrode 34 in the infrared semiconductor laser device 300 and a p-side pad electrode 14 in the blue-violet semiconductor laser device 100a are electrically connected to each other, and a p-side pad electrode 24 in the red semiconductor laser device 200 and the p-side pad electrode 14 in the blue-violet semiconductor laser device 100a are electrically connected to each other. In this case, a common electrode is used as the p-side pad electrode 14 in the blue-violet semiconductor laser device 100a, the p-side pad electrode 24 in the red semiconductor laser device 200, and the p-side pad electrode 34 in the infrared semiconductor laser device 300.

The width in the Y-direction of the blue-violet semiconductor laser device 100a is larger than the sum of the width in the Y-direction of the red semiconductor laser device 200 and the width in the Y-direction of the infrared semiconductor laser device 300. Thus, a part of the p-side pad electrode 14 is exposed when the red semiconductor laser device 200 and the infrared semiconductor laser device 300 are joined to the blue-violet semiconductor laser device 100a. A wire 1W, described later, is connected to an exposed region of the p-side pad electrode 14.

A voltage is applied between the p-side pad electrode 14 and an n-electrode 15 in the blue-violet semiconductor laser device 10a so that the laser beam having the wavelength of approximately 405 nm is emitted in the X-direction from a blue-violet emission point 16.

A voltage is applied between the p-side pad electrode 24 and an n-electrode 25 in the red semiconductor laser device 200 so that the laser beam having the wavelength of approximately 650 nm is emitted in the X-direction from a red emission point 26.

A voltage is applied between the p-side pad electrode 34 and the n-electrode 35 in the infrared semiconductor laser device 300 so that the laser beam having the wavelength of approximately 780 nm is emitted in the X-direction from a region (hereinafter referred to as an infrared emission point) 36 above the ridge RiIr on a junction interface of the n-type semiconductor layer 31 and the p-type semiconductor layer 32.

Figure 7:
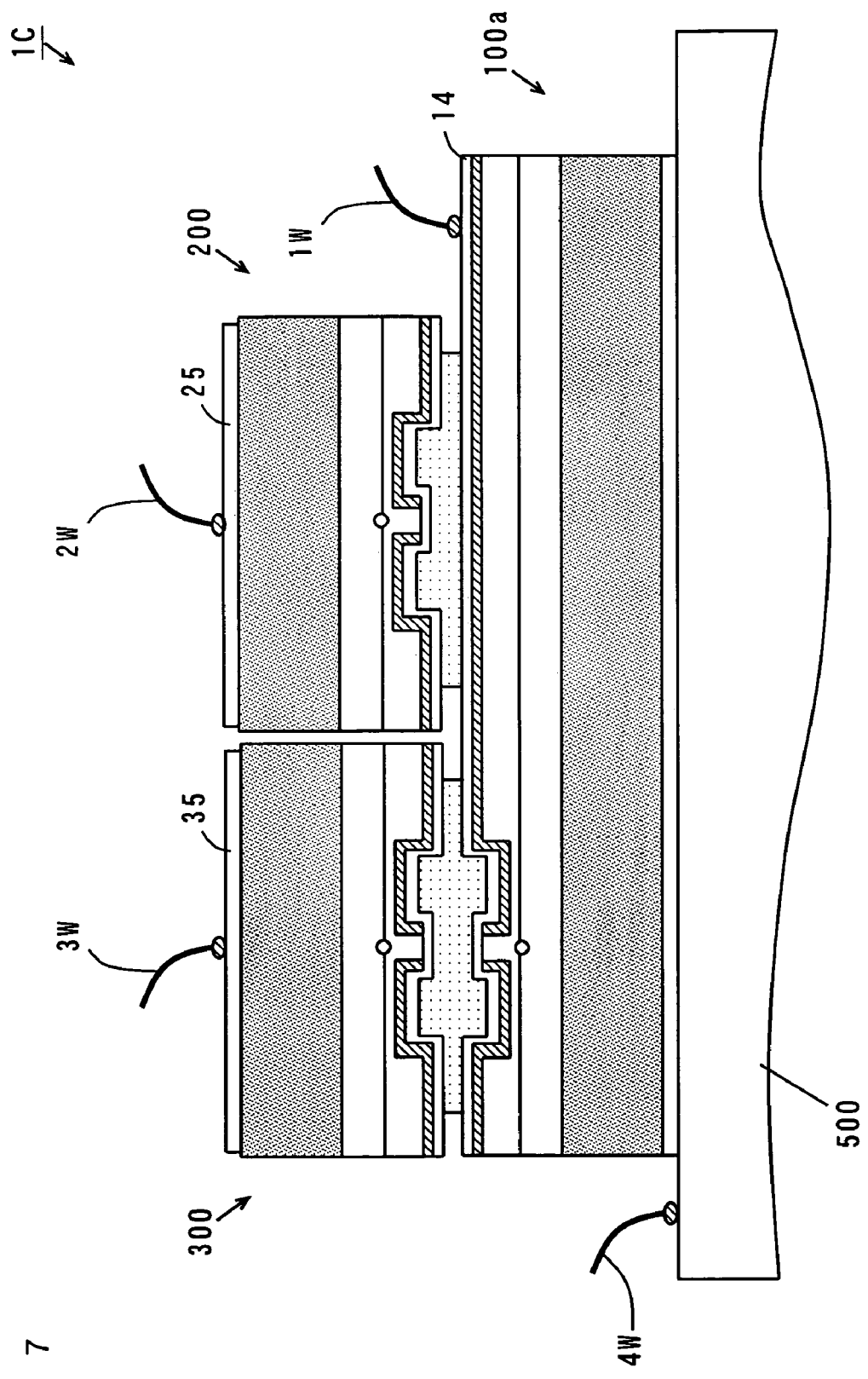
FIG. 7 is a schematic sectional view showing a state where the semiconductor laser apparatus shown in FIG. 6 is joined to a sub-mount.

FIG. 7 is a schematic sectional view showing a state where the semiconductor laser apparatus 1C shown in FIG. 6 is joined to a sub-mount. In a case where the semiconductor laser apparatus 1C shown in FIG. 6 is mounted within a package, the semiconductor laser apparatus 1C is mounted on a sub-mount 500 composed of a metal such as Cu, CuW, or Al, as shown in FIG. 7. The p-side pad electrodes 14, 24, and 34 and the n-electrodes 15, 25, and 35 are wired using wires 1W, 2W, 3W, and 4W.

The p-side pad electrode 14 in the blue-violet semiconductor laser device 100a is connected to a first power feed pin (not shown) provided within the package by the wire 1W. The n-electrode 25 in the red semiconductor laser device 200 is connected to a second power feed pin (not shown) provided within the package by the wire 2W. The n-electrode 35 in the infrared semiconductor laser device 300 is connected to a third power feed pin (not shown) provided within the package by the wire 3W.

The n-electrode 15 in the blue-violet semiconductor laser device 100a is wired by joining the n-electrode 15 to a surface of the sub-mount 500. Thus, the n-electrode 15 and the surface of the sub-mount 500 are electrically connected to each other. The sub-mount 500 is connected to a fourth power feed pin (not shown) provided within the package by a wire 4W.

The blue-violet semiconductor laser device 100a can be driven by applying a voltage between the wire 1W and the wire 4W through the first power feed pin and the fourth power feed pin, the red semiconductor laser device 200 can be driven by applying a voltage between the wire 1W and the wire 2W through the first power feed pin and the second power feed pin, and the infrared semiconductor laser device 300 can be driven by applying a voltage between the wire 1W and the wire 3W through the first power feed pin and the third power feed pin. The blue-violet semiconductor laser device 100a, the red semiconductor laser device 200, and the infrared semiconductor laser device 300 can be thus independently driven.

The configuration of the infrared semiconductor laser device 300 will be further described in detail below.

Figure 8:
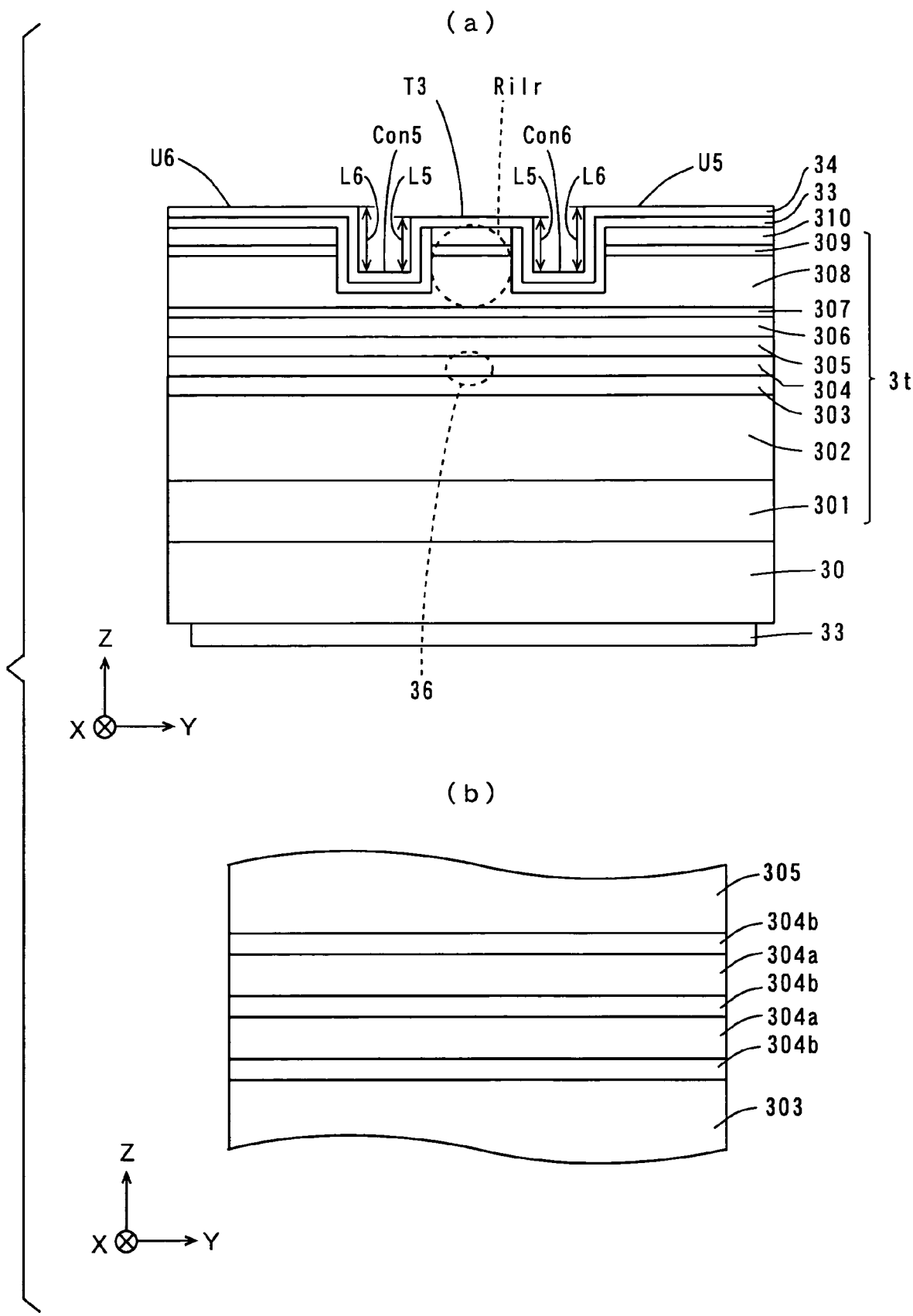
FIG. 8 is a schematic sectional view showing the details of an infrared semiconductor laser device.

FIG. 8 is a schematic sectional view showing the details of the infrared semiconductor laser device 300.

When the infrared semiconductor laser device 300 is manufactured, a semiconductor layer 3t in which the n-type semiconductor layer 31 and the p-type semiconductor layer 32 are stacked on the n-GaAs substrate 30, as described above, is formed.

As shown in FIG. 8(a), an n-GaAs layer 301, an n-AlGaAs cladding layer 302, an undoped AlGaAs optical guide layer 303, an MQW active layer 304, an undoped AlGaAs optical guide layer 305, a p-AlGaAs first cladding layer 306, a p-AlGaAs etching stop layer 307, a p-AlGaAs second cladding layer 308, and a p-GaAs contact layer 309 are formed in this order as the semiconductor layer 3t on the one surface of the n-GaAs substrate 30. The layers are formed by MOCVD, for example. Further, an electrode layer 310 composed of Cr/Au is formed on the p-GaAs contact layer 309.

As shown in FIG. 8(b), the MQW active layer 304 has a structure in which two undoped AlGaAs barrier layers 304a and three undoped AlGaAs well layers 304b are alternately stacked.

Here, the Al composition of the n-AlGaAs cladding layer 302 is 0.45, and the Ga composition thereof is 0.55, for example. Si is doped into the n-GaAs layer 301 and the n-AlGaAs cladding layer 302.

The Al composition of the undoped AlGaAs optical guide layer 303 is 0.35, and the Ga composition thereof is 0.65. The Al composition of the undoped AlGaAs barrier layer 304a is 0.35, and the Ga composition thereof is 0.65. The Al composition of the undoped AlGaAs well layer 304b is 0.10, and the Ga composition thereof is 0.90. The Al composition of the undoped AlGaAs optical guide layer 305 is 0.35, and the Ga composition thereof is 0.65.

Furthermore, the Al composition of the p-AlGaAs first cladding layer 306 is 0.45, and the Ga composition thereof is 0.55. The Al composition of the p-AlGaAs etching stop layer 307 is 0.70, and the Ga composition thereof is 0.30.

The Al composition of the p-AlGaAs second cladding layer 308 is 0.45, and the Ga composition thereof is 0.55.

Zn is doped into the p-AlGaAs first cladding layer 306, the p-AlGaAs etching stop layer 307, the p-AlGaAs second cladding layer 308, and the p-GaAs contact layer 309.

A pair of striped recesses extending in the X-direction with predetermined spacing is formed in the p-AlGaAs second cladding layer 308, the p-GaAs contact layer 309, and the electrode layer 310. Thus, a ridge RiIr extending in the X-direction is formed between the recesses. The ridge RiIr has a width of approximately 2.8 μm. Further, raised portions are respectively formed in regions outside the pair of recesses.

An insulating layer 33 is formed so as to cover a side surface and a bottom surface of each of the recesses and an upper surface of each of the raised portions. Further, a p-side pad electrode 34 is formed so as to cover the insulating layer 33 and an upper surface of the ridge RiIr. Thus, a striped projection T3 corresponding to the ridge RiIr and a pair of raised portions U5 and U6 are formed on an upper surface of the infrared semiconductor laser device 300. Recesses Con5 and Con6 are respectively formed between the projection T3 and the pair of raised portions U5 and U6. An n-electrode 35 composed of AuGe/Ni/Au is formed on the other surface of the n-GaAs substrate 30.

Since the insulating layer 33 is not formed on the ridge RiIr, the height L5 of the projection T3 becomes smaller by the thickness of the insulating layer 33, as compared with the height L6 of the raised portions U5 and U6.

In the infrared semiconductor laser device 300, an infrared emission point 36 is formed at a position of the MQW active layer 304 below the ridge RiIr.

As described in the foregoing, in the present embodiment, the blue-violet semiconductor laser device 100a, the red semiconductor laser device 200, and the infrared semiconductor laser device 300 are integrally formed, so that the spacings among the blue-violet emission point 16, the red emission point 26, and the infrared emission point 36 can be shortened. This allows all the blue-violet emission point 16, the red emission point 26, and the infrared emission point 36 to be brought near the center of the package. As a result, a common optical system can be used for laser beams respectively emitted from the blue-violet emission point 16, the red emission point 26, and the infrared emission point 36.

The infrared semiconductor laser device 300 is joined to the blue-violet semiconductor laser device 100a such that the projection T1 and the projection T3 are opposed to each other, so that the distance between the blue-violet emission point 16 and the infrared emission point 36 can be further shortened.

The height L1 of the projection T1 in the blue-violet semiconductor laser device 100a is smaller than the height L2 of the raised portions U1 and U2, and the height L5 of the projection T3 in the infrared semiconductor laser device 300 is smaller than the height L6 of the raised portions U5 and U6.

In this case, the raised portions U1 and U2 and the raised portions U5 and U6 come into contact with each other when the blue-violet semiconductor laser device 100a and the infrared semiconductor laser device 300 are joined to each other, which can prevent the projections T1 and the projection T3 from coming into contact with each other.

The height L3 of the projection T2 in the red semiconductor laser device 200 is smaller than the height L4 of the raised portions U3 and U4. In this case, the raised portions U3 and U4 and the raised portion U2 come into contact with each other even if the red semiconductor laser device 200 is joined to the raised portion U2 in the blue-violet semiconductor laser device 100a with the projection T2 positioned on its lower side, which can prevent the projection T2 and the raised portion U2 from coming into contact with each other.

These results allow stresses respectively applied to ridges RiB, RiR, and RiIr to be reduced, so that the characteristics can be prevented from being degraded by the stresses. Thus, the reliability of the semiconductor laser apparatus 1C is improved.

The raised portions U1 and U2 and the raised portions U5 and U6 come into contact with each other so that the contact area between the blue-violet semiconductor laser device 100a and the infrared semiconductor laser device 300 is increased. This allows the infrared semiconductor laser device 300 to be joined to the blue-violet semiconductor laser device 100a in a stable state.

The raised portion U2 and the raised portions U3 and U4 come into contact with each other so that the contact area between the blue-violet semiconductor laser device 100a and the red semiconductor laser device 200 is increased. This allows the red semiconductor laser device 200 to be joined to the blue-violet semiconductor laser device 100a in a stable state.

These results allow the assembling precision of the semiconductor laser apparatus 1C to be improved.

The contact area between the blue-violet semiconductor laser device 100a and the infrared semiconductor laser device 300 is increased, so that the blue-violet semiconductor laser device 100a and the infrared semiconductor laser device 300 can be reliably joined to each other with a small amount of solder H. This can prevent a part of the solder H from being detoured around a side surface of the blue-violet semiconductor laser device 100a. As a result, the semiconductor laser apparatus 1C can be prevented from being short-circuited.

Furthermore, the contact area between the blue-violet semiconductor laser device 100a and the red semiconductor laser device 200 is increased, so that the blue-violet semiconductor laser device 100a and the red semiconductor laser device 200 can be reliably joined to each other with a small amount of solder H. Thus, a part of the melted solder H can be prevented from flowing out into a portion, to which the wire 1W is connected, on the p-side pad electrode 14 in the blue-violet semiconductor laser device 100a. This can prevent defective contact of the wire 1.

The recesses Con1, Con2, Con3, Con4, Con5, and Con6 serve to accommodate the solder H, so that the solder H can be reliably prevented from flowing out. This can reliably prevent short-circuit of the semiconductor laser apparatus 1C and defective contact of the wire 1W.

These results allow the manufacturing yield of the semiconductor laser apparatus 1C to be improved.

As a result of the foregoing, it is possible to shorten the distance between the respective emission points of the laser beams as well as to improve the reliability and the manufacturing yield of the semiconductor laser apparatus 1C.

It is preferable that the respective widths in the Y-direction of the recesses Con5 and Con6 are not less than 5 μm. In this case, the solder H can be sufficiently accommodated in the recesses Con5 and Con6.

The difference in effective refractive index between regions of the MQW active layer 304 below the recesses Con5 and Con6 and a region of the MQW active layer 304 below the ridge RiIr can be ensured, which allows the effect of light confinement into the region below the ridge RiIr to be reliably obtained.

Furthermore, the insulating layer 33 and the p-side pad electrode 34 can be reliably formed.

It is more preferable that the respective widths in the Y-direction of the recesses Con5 and Con6 are not less than 10 μm. In this case, the solder H can be reliably accommodated in the recesses Con 5 and Con6. The effect of light confinement into the region below the ridge RiIr can be improved. Further, the insulating layer 33 and the p-side pad electrode 34 can be reliably formed.

It is preferable that the respective widths in the Y-direction of the recesses Con5 and Con6 are not more than one-fourth the width in the Y-direction of the infrared semiconductor laser device 300. In this case, the contact area between the blue-violet semiconductor laser device 100a and the infrared semiconductor laser device 300 can be sufficiently ensured.

It is more preferable that the respective widths in the Y-direction of the recesses Con5 and Con6 are not more than 150 μm. In this case, the contact area between the blue-violet semiconductor laser device 100a and the infrared semiconductor laser device 300 can be sufficiently increased.

It is more preferable that the respective widths in the Y-direction of the recesses Con5 and Con6 are not more than 30 μm. In this case, the contact area between the blue-violet semiconductor laser device 10a and the infrared semiconductor laser device 300 can be further increased.

The recesses Con1, Con2, Con3, Con4, Con5, and Con6 may respectively have different widths.

Although in the above-mentioned embodiment, the infrared semiconductor laser device 300 is positioned above the blue-violet emission point 16, the respective positions of the red semiconductor laser device 200 and the infrared semiconductor laser device 300 may be exchanged.

Although in the above-mentioned embodiment, each of the blue-violet semiconductor laser device 100a and the infrared semiconductor laser device 300 is provided with the raised portions, either one of the blue-violet semiconductor laser device 100a and the infrared semiconductor laser device 300 may be only provided with the raised portions. In this case, the projection T1 and the projection T2 can be prevented from coming into contact with each other by making the respective heights of the raised portions larger than the total height of the projections T1 and T2.

Fourth Embodiment

Figure 9:
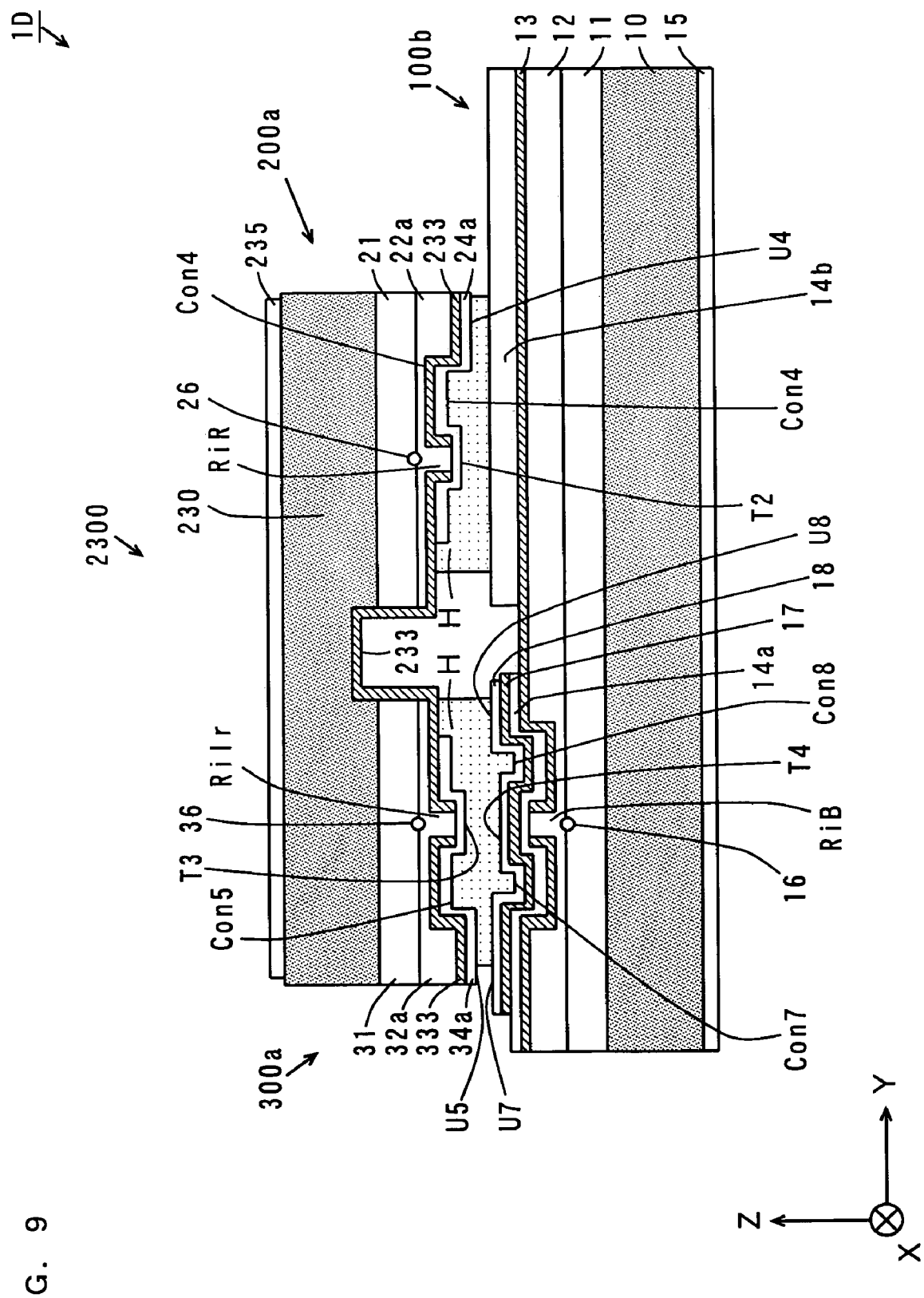
FIG. 9 is a schematic sectional view showing an example of a semiconductor laser apparatus according to a fourth embodiment.

FIG. 9 is a schematic sectional view showing an example of a semiconductor laser apparatus according to a fourth embodiment.

As shown in FIG. 9, in a semiconductor laser apparatus 1D according to the present embodiment, a monolithic red/infrared semiconductor laser device 2300 having a red semiconductor laser device 200a and an infrared semiconductor laser device 300a integrally formed therein is joined to a blue-violet semiconductor laser device 100b.

The blue-violet semiconductor laser device 100b and the monolithic red/infrared semiconductor laser device 2300 will be described below.

The blue-violet semiconductor laser device 100b comprises an n-electrode 15, an n-GaN substrate 10, an n-type semiconductor layer 11, a p-type semiconductor laser 12, and an insulating layer 13, similarly to the blue-violet semiconductor laser device 100a shown in FIG. 6.

A p-side pad electrode 14a is formed in a region having a predetermined width at one end of the insulating layer 13. An insulating layer 17 and a p-side pad electrode 18 are formed in a region having a predetermined width on the p-side pad electrode 14a. Thus, a striped projection T4 corresponding to a ridge RiB and a pair of raised portions U7 and U8 are formed on an upper surface at one end of the blue-violet semiconductor laser device 100b. Recesses Con7 and Con8 are respectively formed between the projection T4 and the pair of raised portions U7 and U8.

Since the insulating layer 13 is not formed on an upper surface of the ridge RiB, the height of the projection T4 becomes smaller by the thickness of the insulating layer 13, as compared with the respective heights of the raised portions U7 and U8. A region having a predetermined width at respective one ends of the p-side pad electrodes 14a and 18 is exposed, A p-side pad electrode 14b is formed in a region having a predetermined width at the other end of the insulating layer 13. The height of an upper surface of the p-side pad electrode 18 and the height of an upper surface of the p-side pad electrode 14b are nearly equal to each other.

The monolithic red/infrared semiconductor laser device 2300 comprises an n-electrode 235 and an n-GaAs substrate 230, the infrared semiconductor laser 300a is formed at one end of the n-GaAs substrate 230, and the red semiconductor laser device 200a is formed at the other end of the n-GaAs substrate 230.

An n-type semiconductor layer 31 similar to that shown in FIG. 6 is formed in a region having a predetermined width on a lower surface at one end of the n-GaAs substrate 230, and a p-type semiconductor layer 32a is formed on a lower surface of the n-type semiconductor layer 31.

A ridge RiIr similar to that shown in FIG. 6 is formed at the center on a lower surface of the p-type semiconductor layer 32a. A raised portion is formed a predetermined distance apart from the ridge RiIr on one side thereof. Thus, a recess similar to that shown in FIG. 6 is formed between the ridge RiIr and the raised portion. No recess and raised portion are formed on the other side of the ridge RiIr.

An n-type semiconductor layer 21 similar to that shown in FIG. 6 is formed in a region having a predetermined width on a lower surface at the other end of the n-GaAs substrate 230, and a p-type semiconductor layer 22a is formed on a lower surface of the n-type semiconductor layer 21.

A ridge RiR similar to that shown in FIG. 6 is formed at the center on a lower surface of the p-type semiconductor layer 22a. A raised portion is formed a predetermined distance apart from the ridge RiR on one side thereof. Thus, a recess similar to that shown in FIG. 6 is formed between the ridge RiR and the raised portion. No recess and raised portion are formed on the other side of the ridge RiR (on the side of the infrared semiconductor laser device 300a).

An infrared emission point 36 similar to that shown in FIG. 6 is formed in a region above the ridge RiIr on a junction interface of the n-type semiconductor layer 31 and the p-type semiconductor layer 32a, and a red emission point 26 similar to that shown in FIG. 1 is formed in a region above the ridge RiR on a junction interface of the n-type semiconductor layer 21 and the p-type semiconductor layer 22a.

An insulating layer 233 is formed so as to cover side surfaces and a bottom surface of a recess formed between the n-type semiconductor layer 31 and the n-type semiconductor layer 21 and between the p-type semiconductor layer 32a and the p-type semiconductor layer 22a, and a region, excluding a lower surface of the ridge RiIr, on the side of the lower surface of the p-type semiconductor layer 32a and a region, excluding a lower surface of the ridge RiR, on the side of the lower surface of the p-type semiconductor layer 22a. Further, a p-side pad electrode 34a is formed in a region having a predetermined width at one end of the insulating layer 233, and a p-side pad electrode 24a is formed in a region having a predetermined width at the other end of the insulating layer 233.

Thus, a projection T3 and a raised portion U5 similar to those shown in FIG. 6 are formed on a lower surface of the infrared semiconductor laser device 300a, and a projection T2 and a raised portion U4 similar to those shown in FIG. 6 are formed on a lower surface of the red semiconductor laser device 200a. A recess Con5 similar to that shown in FIG. 6 is formed between the projection T3 and the raised portion U5, and a recess Con4 similar to that shown in FIG. 6 is formed between the projection T2 and the raised portion U4.

The blue-violet semiconductor laser device 100b and the monolithic red/infrared semiconductor laser device 2300 are joined to each other with a solder H such that the projection T4 and the projection T3 are opposed to each other and the projection T2 is positioned on the p-side pad electrode 14b.

Thus, the p-side pad electrode 34a in the infrared semiconductor laser device 300a and the p-side pad electrode 18 in the blue-violet semiconductor laser device 100b are electrically connected to each other, and the p-side pad electrode 24a in the red semiconductor laser device 200a and the p-side pad electrode 14b in the blue-violet semiconductor laser device 100b are electrically connected to each other.

Figure 10:
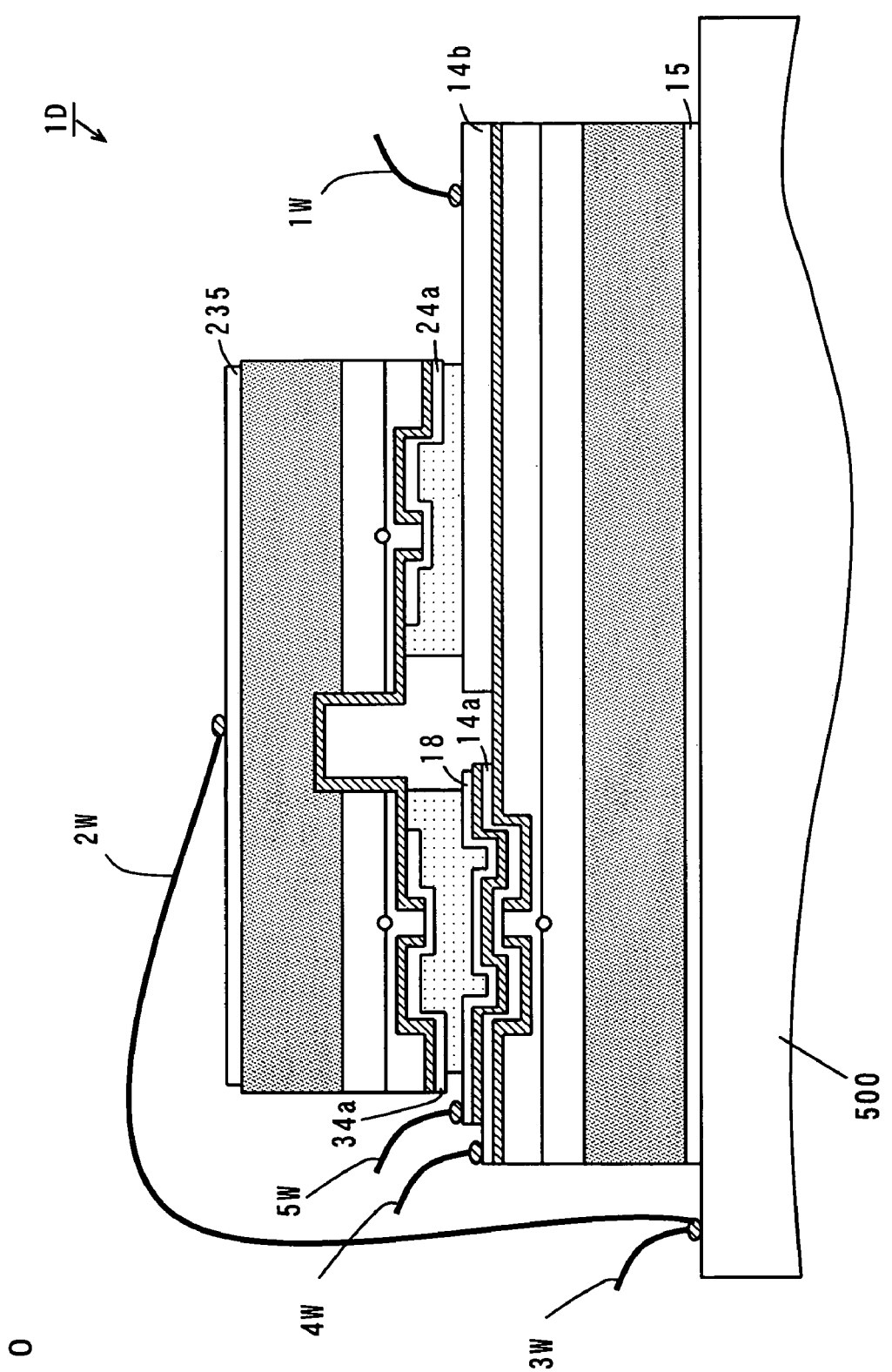
FIG. 10 is a schematic sectional view showing a state where the semiconductor laser apparatus shown in FIG. 9 is joined to a sub-mount.

FIG. 10 is a schematic sectional view showing a state where the semiconductor laser apparatus 1D shown in FIG. 9 is joined to a sub-mount. In a case where the semiconductor laser apparatus 1D shown in FIG. 9 is mounted within a package, the semiconductor laser apparatus 1D is mounted on a sub-mount 500 composed of a metal such as Cu, CuW, or Al, as shown in FIG. 10. The p-side pad electrodes 14a, 14b, 24a, 18, and 34a and the n-electrodes 15 and 235 are wired using wires 1W, 2W, 3W, 4W, and 5W.

The p-side pad electrode 14b in the blue-violet semiconductor laser device 100b is connected to a first power feed pin (not shown) provided within the package by the wire 1W. The n-electrode 235 in the red semiconductor laser device 200a is connected to a second power feed pin (not shown) provided within the package by the wire 2W.

The n-electrode 15 in the blue-violet semiconductor laser device 100b is wired by joining the n-electrode 15 to a surface of the sub-mount 500. Thus, the n-electrodes 15 and 235 and the sub-mount 500 are respectively electrically connected to each other. The sub-mount 500 is connected to a third power feed pin (not shown) provided within the package by the wire 3W.

The p-side pad electrode 14a in the blue-violet semiconductor laser device 100b is connected to a fourth power feed pin (not shown) provided within the package by the wire 4W. The p-side pad electrode 18 in the blue-violet semiconductor laser device 100b is connected to a fifth power feed pin (not shown) provided within the package by the wire 5W.

The red semiconductor laser device 200a can be driven by applying a voltage between the wire 1W and the wire 3W through the first power feed pin and the third power feed pin, the blue-violet semiconductor laser device 100b can be driven by applying a voltage between the wire 4W and the wire 3W through the fourth power feed pin and the third power feed pin, and the infrared semiconductor laser device 300a can be driven by applying a voltage between the wire 5W and the wire 3W through the fifth power feed pin and the third power feed pin. The blue-violet semiconductor laser device 10b, the red semiconductor laser device 200a, and the infrared semiconductor laser device 300a can be thus independently driven.

As described in the foregoing, in the present embodiment, the blue-violet semiconductor laser device 100b and the monolithic red/infrared semiconductor laser device 2300 are integrally formed, so that the spacings among the blue-violet emission point 16, the red emission point 26, and the infrared emission point 36 can be shortened. This allows all the blue-violet emission point 16, the red emission point 26, and the infrared emission point 36 to be brought near the center of the package. As a result, a common optical system can be used for laser beams respectively emitted from the blue-violet emission point 16, the red emission point 26, and the infrared emission point 36.

The infrared semiconductor laser device 300a is joined to the blue-violet semiconductor laser device 100b such that the projection T4 and the projection T3 are opposed to each other, so that the distance between the blue-violet emission point 16 and the infrared emission point 36 can be further shortened.

The height of the projection T4 in the blue-violet semiconductor laser device 100b is smaller than the height of the raised portion U7, and the height of the projection T3 in the infrared semiconductor laser device 300a is smaller than the height of the raised portion U5. In this case, the raised portions U7 and U5 come into contact with each other when the blue-violet semiconductor laser device 100b and the monolithic red/infrared semiconductor laser device 2300 are joined to each other, which can prevent the projection T4 and the projection T3 from coming into contact with each other.

The height of the projection T2 in the red semiconductor laser device 200a is smaller than the height of the raised portion U4. In this case, the p-side pad electrode 14b and the raised portion U4 come into contact with each other when the blue-violet semiconductor laser device 100b and the monolithic red/infrared semiconductor laser device 2300 are joined to each other, which can prevent the projection T2 from coming into contact with the p-side pad electrode 14b.

These results allow stresses respectively applied to the ridges RiB, RiIr, and RiR to be reduced, so that the characteristics can be prevented from being degraded by the stresses. As a result, the reliability of the semiconductor laser apparatus 1D is improved.

The monolithic red/infrared semiconductor laser device 2300 is supported by the raised portions U4 and U5, so that the monolithic red/infrared semiconductor laser device 2300 can be joined to the blue-violet semiconductor laser device 100b in a stable state.

These results allow the assembling precision of the semiconductor laser apparatus 1D to be improved.

The contact area between the blue-violet semiconductor laser device 100b and the monolithic red/infrared semiconductor laser device 2300 is increased, so that the blue-violet semiconductor laser device 100b and the monolithic red/infrared semiconductor laser device 2300 can be reliably joined to each other with a small amount of solder H. This can prevent a part of the solder H from being detoured around a side surface of the blue-violet semiconductor laser device 10b, and a part of the melted solder H can be prevented from flowing out into a portion, to which the wires 1W, 4W, and 5W are connected, on the p-side pad electrodes 14b, 14a, and 18. The result can prevent short-circuit of the semiconductor laser apparatus 1D and defective contact of the wire 1W.

The recesses Con4, Con5, Con6, Con7, and Con8 serve to accommodate the solder H, so that the solder H can be reliably prevented from flowing out. This can reliably prevent short-circuit of the semiconductor laser apparatus 1D and defective contact of the wires 1W, 4W, and 5W.

These results allow the manufacturing yield of the semiconductor laser apparatus 1D to be improved.

As a result of the foregoing, it is possible to shorten the distance between the respective emission points of the laser beams as well as to improve the reliability and the manufacturing yield of the semiconductor laser apparatus 1D.

It is preferable that the respective widths in the Y-direction of the recesses Con7 and Con8 are not less than 5 μm. In this case, the solder H can be sufficiently accommodated in the recesses Con7 and Con8.

The difference in effective refractive index between regions of the MQW active layer 104 below the recesses Con7 and Con8 and a region of the MQW active layer 104 below the ridge RiB can be ensured, which allows the effect of light confinement into the region below the ridges RiB to be reliably obtained.

Furthermore, the insulating layers 13 and 17 and the p-side pad electrodes 14a and 18 can be reliably formed.

It is more preferable that the respective widths in the Y-direction of the recesses Con7 and Con8 are not less than 10 μm. In this case, the solder H can be reliably accommodated in the recesses Con7 and Con8. Further, the effect of light confinement into the region below the ridges RiB can be improved. Further, the insulating layers 13 and 17 and the p-side pad electrodes 14a and 18 can be reliably formed.

It is preferable that the respective widths in the Y-direction of the recesses Con7 and Con8 are not more than one-fourth the width in the Y-direction of the infrared semiconductor laser device 300a. In this case, the contact area between the blue-violet semiconductor laser device 100b and the infrared semiconductor laser device 300a can be sufficiently ensured.

It is more preferable that the respective widths in the Y-direction of the recesses Con7 and Con8 are not more than 150 μm. In this case, the contact area between the blue-violet semiconductor laser device 100b and the infrared semiconductor laser device 300a can be sufficiently increased.

It is more preferable that the respective widths in the Y-direction of the recesses Con7 and Con8 are not more than 30 μm. In this case, the contact area between the blue-violet semiconductor laser device 100b and the infrared semiconductor laser device 300a can be further increased.

The recesses Con4, Con5, Con7, and Con8 may respectively have different widths.

Although in the above-mentioned embodiment, each of the blue-violet semiconductor laser device 100b and the monolithic red/infrared semiconductor laser device 2300 is provided with raised portions, the blue-violet semiconductor laser device 100b need not be provided with the raised portions. In this case, the projection T3 and the projection T4 can be prevented from coming into contact with each other by making the respective heights of the raised portions U4 and U5 larger than the total height of the projections T3 and T4.

The raised portion U5 in the infrared semiconductor laser device 300a need not be provided. In this case, the projection T3 and the projection T4 can be prevented from coming into contact with each other by making the height of the raised portion U7 larger than the respective heights of the projections T3 and T4.

The raised portion U4 in the red semiconductor laser device 200a need not be provided. In this case, a raised portion higher than the projection T2 may be formed on at least one side of the projection T2 in a region, below the red semiconductor laser device 200a, on the blue-violet semiconductor laser device 100b. This can prevent the projection T2 from coming into contact with the p-side pad electrode 14b.

Although in the above-mentioned embodiment, a recess and a raised portion are formed on one side of each of the ridge RiR and the ridge RiIr, they may be formed on both sides thereof.

In the first to fourth embodiments, the respective n-GaN substrates 10 in the blue-violet semiconductor laser devices 100, 100a, and 100b are n-GaN wafers, and the respective n-GaAs substrates 20, 30, and 230 in the red semiconductor laser devices 200 and 200a and the infrared semiconductor laser devices 300 and 300a are n-GaAs wafers.

As the blue-violet semiconductor laser devices 100 and 100a, a plurality of blue-violet semiconductor laser devices are manufactured by forming a semiconductor layer 1t on an n-GaN wafer and dividing the n-GaN wafer having the semiconductor layer formed thereon into a plurality of chips.

As the red semiconductor laser device 200, a plurality of red semiconductor laser devices are manufactured by forming a semiconductor layer 2t on an n-GaAs wafer and dividing the n-GaAs wafer having the semiconductor layer formed thereon into a plurality of chips.

As the infrared semiconductor laser device 300, a plurality of infrared semiconductor laser devices are manufactured by forming a semiconductor layer 3t on an n-GaAs wafer and dividing the n-GaAs wafer having the semiconductor layer formed thereon into a plurality of chips.

Furthermore, as the monolithic red/infrared semiconductor laser device 2300, a plurality of monolithic red/infrared semiconductor laser devices are manufactured by forming semiconductor layers 2t and 3t on an n-GaAs wafer and dividing the n-GaAs wafer having the semiconductor layers formed thereon into a plurality of chips.

Therefore, as the semiconductor laser apparatuses 1A, 1B, 1C, and 1D, a plurality of semiconductor laser apparatuses can be manufactured by joining the n-GaN wafer and the n-GaAs wafer each having the semiconductor layer formed thereon to each other and dividing their joined member.

However, the semiconductor laser apparatuses 1A, 1B, 1C, and 1D may be manufactured by previously individually producing chips of the blue-violet semiconductor laser devices 100, 100a, and 10b, chips of the red semiconductor laser devices 200 and 200a, chips of the infrared semiconductor laser device 300, and chips of the monolithic red/infrared semiconductor laser device 2300 and affixing the chips to each other.

Correspondence to Claims

In the following two paragraphs, non-limiting examples of correspondences between various elements recited in the claims below and those described above with respect to various preferred embodiments of the present invention are explained. In the embodiments described above, the blue-violet semiconductor laser devices 100, 100a, and 100b correspond to a first semiconductor laser device, the red semiconductor laser devices 200 and 200a correspond to a second or third semiconductor laser device, the infrared semiconductor laser device 300 corresponds to a second semiconductor laser device, the n-type semiconductor layer 11 and the p-type semiconductor layer 12 correspond to a first semiconductor layer, the n-type semiconductor layer 21 and the p-type semiconductor layer 22 correspond to a second or third semiconductor layer, and the n-type semiconductor layer 31 and the p-type semiconductor layer 32 correspond to a second semiconductor layer.

Further, in the embodiments described above, the blue-violet emission point 16 corresponds to a first emission point, the red emission point 26 corresponds to a second or third emission point, the infrared emission point 36 corresponds to a second emission point, the striped projections T1, T3, and T4 correspond to a first projection, the striped projection T2 corresponds to a second or third projection, the raised portions U1 to U8 correspond to a first raised portion, and the raised portions U3 and U4 correspond to a second raised portion.

Furthermore, in the embodiment described above, the MQW active layer 104 corresponds to a first active layer, the p-AlGaN cladding layer 107 corresponds to a first cladding layer, the ridge RiB corresponds to a first ridge, the MQW active laser 204 corresponds to a second active layer, the p-AlGaInP second cladding layer 208 corresponds to a second cladding layer, the ridge RiR corresponds to a second ridge, and the insulating layers 13, 23, and 33 correspond to a current blocking layer.

Another Embodiment

Although in the embodiments described above, recesses are formed in the p-type semiconductor layers 12, 22, 22a, 32, and 32a to form the recesses Con1, Con2, Con3, Con4, Con5, Con6, Con7, and Con8, recesses may be formed in the insulating layers 13, 23, 23a, 33, and 33a to form the recesses Con1, Con2, Con3, Con4, Con5, Con6, Con7, and Con8, or the recesses Con1, Con2, Con3, Con4, Con5, Con6, Con7, and Con8 may be directly formed in the p-side pad electrodes 14, 24, 24a, 34, and 34a.

Figure 11:
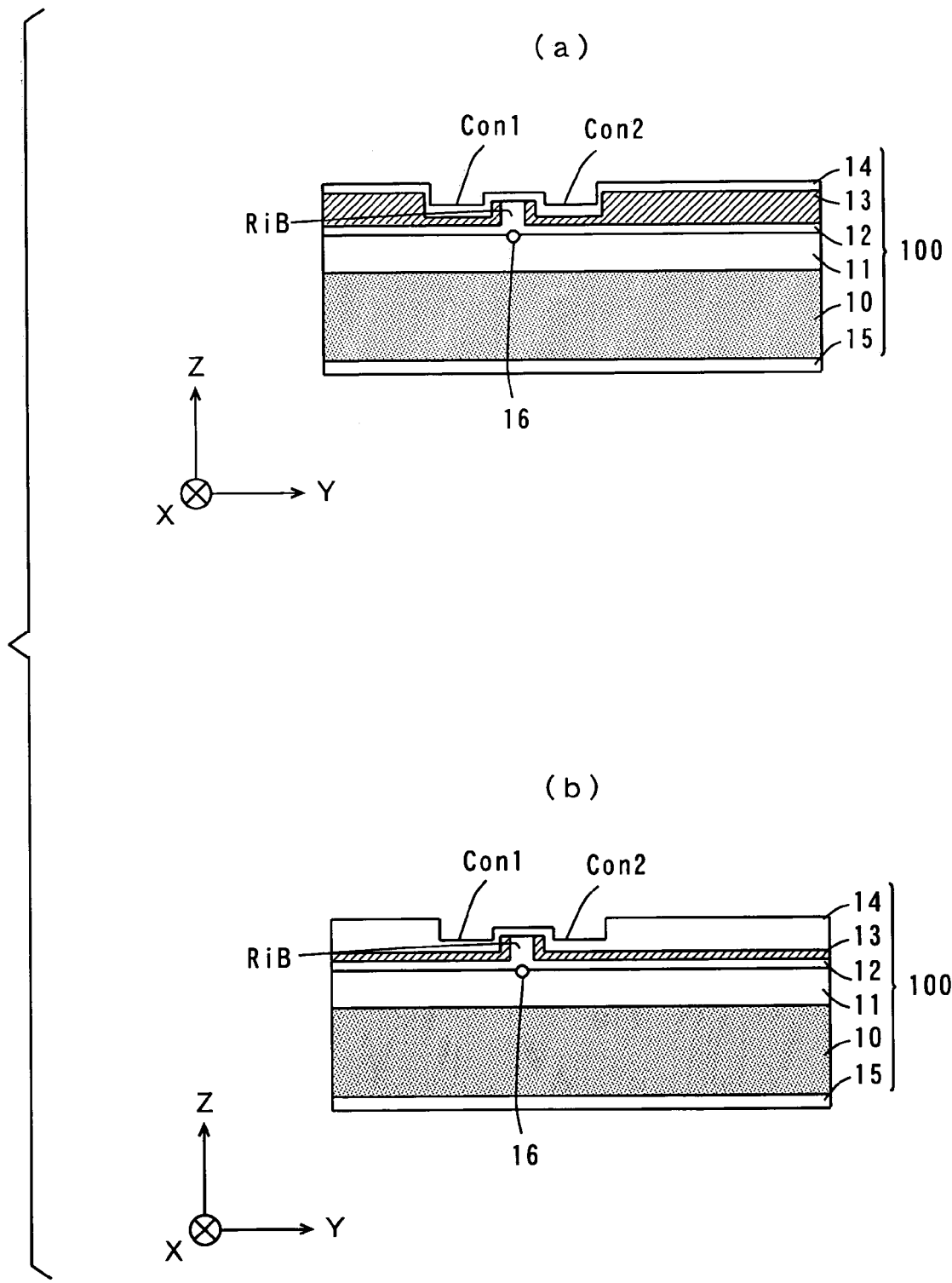
FIG. 11 is a diagram showing another example of a method of forming a recess.
Figure 12:
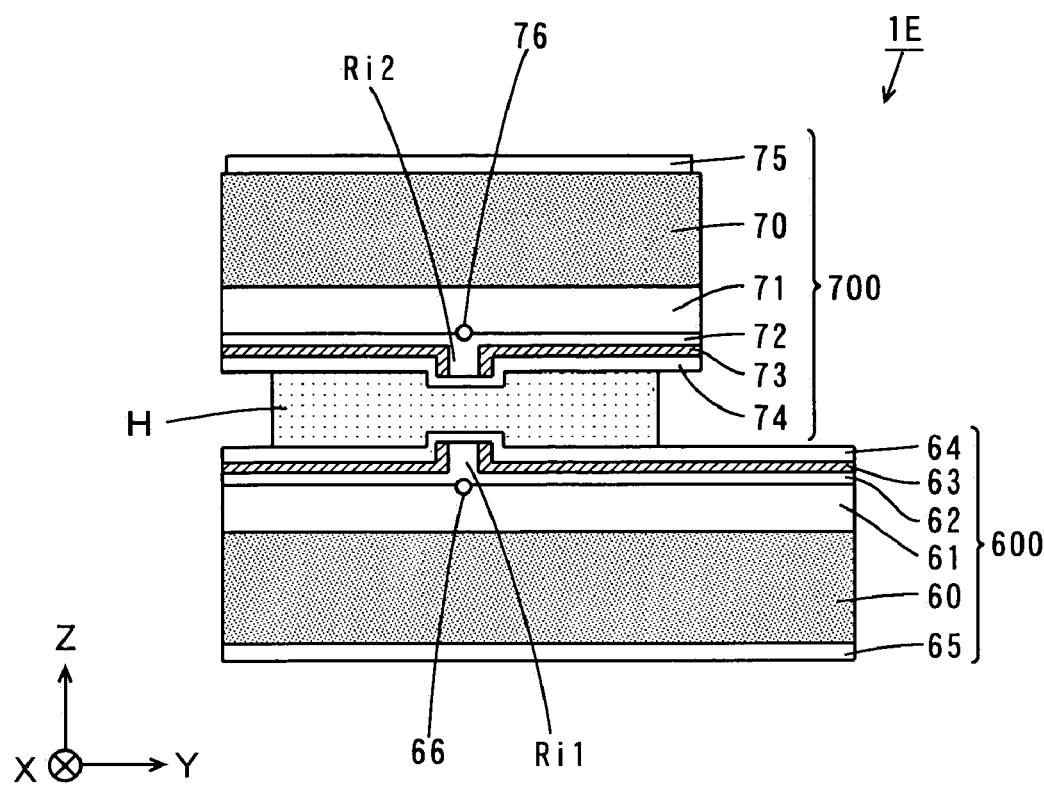
FIG. 12 is a schematic sectional view showing an example of a conventional semiconductor laser apparatus.
Figure 13:
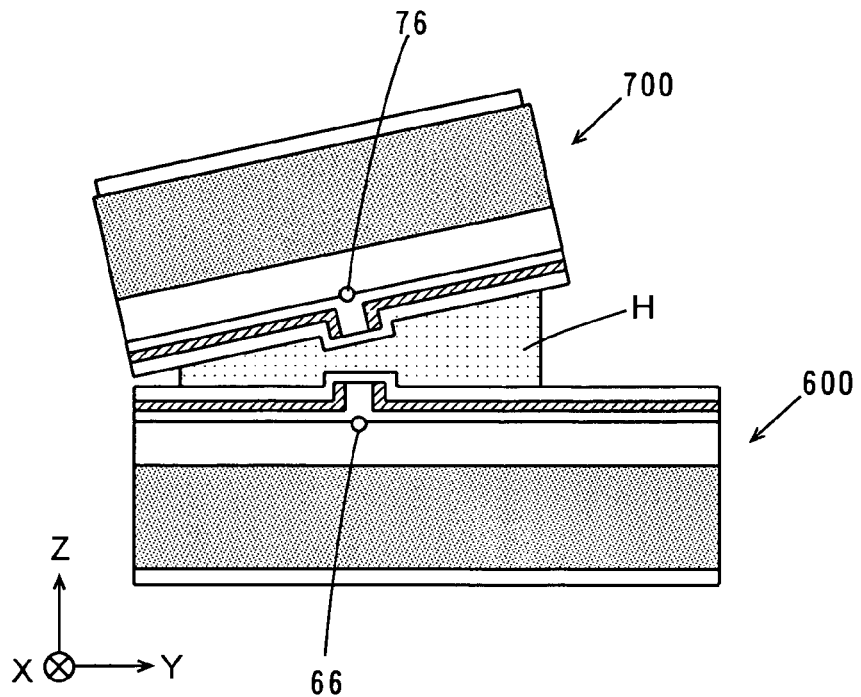
FIG. 13 is a diagram showing an example of the problem of the conventional semiconductor laser apparatus.
Figure 14:
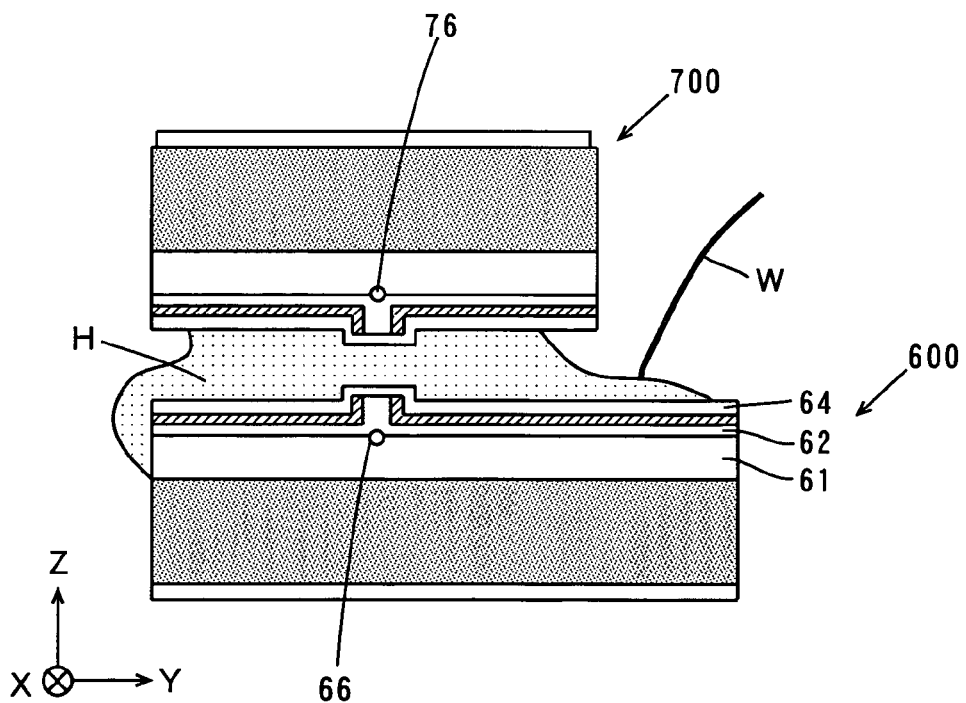
FIG. 14 is a diagram showing an example of the problem of the conventional semiconductor laser apparatus.
Figure 15:
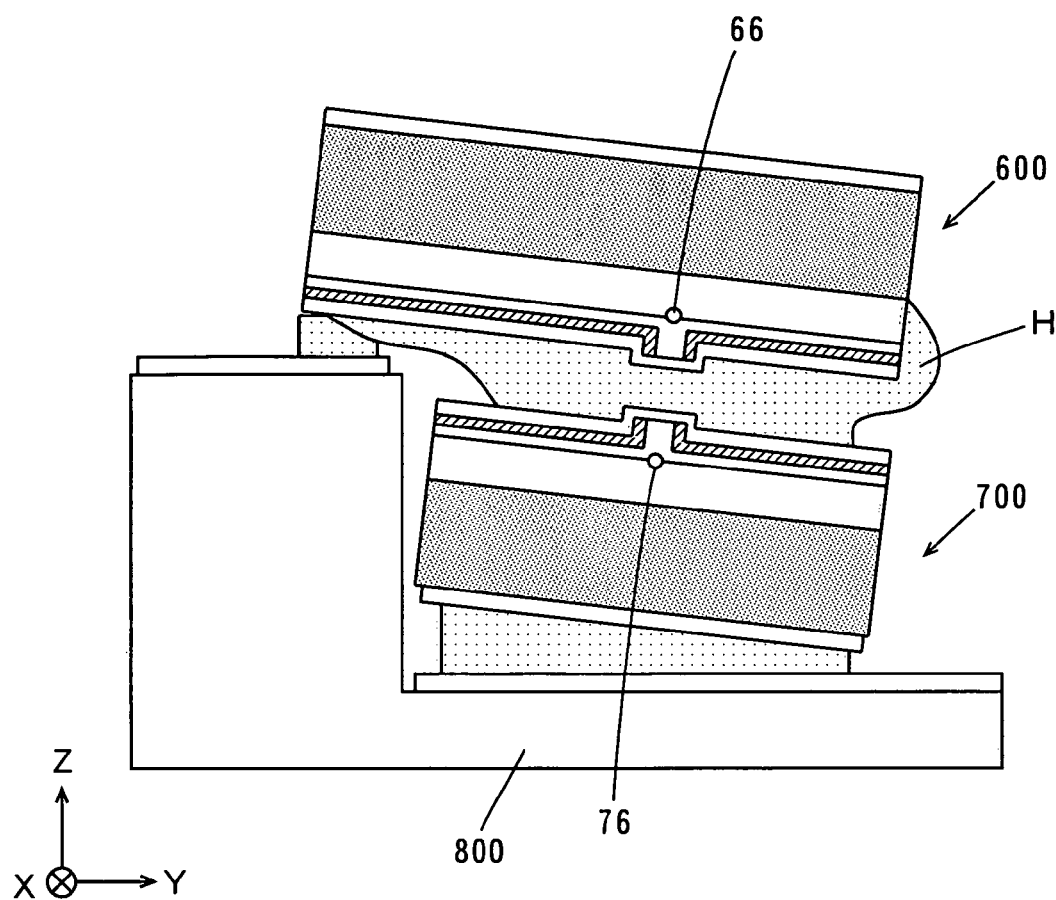
FIG. 15 is a diagram showing an example of the problem of the conventional semiconductor laser apparatus.

For example, in the blue-violet semiconductor laser device 100, the recesses Con1 and Con2 maybe formed by forming recesses in not the p-type semiconductor laser 12 but the insulating layer 13, as shown in FIG. 11(a). The recesses Con1 and Con2 may be directly formed in the p-side pad electrode 14 without forming recesses in the p-side semiconductor layer 12 and the insulating layer 13, as shown in FIG. 11(b).

Although in the embodiments described above, the insulating layer is used as a current blocking layer, a current blocking layer composed of a semiconductor may be used.

Although in the first to third embodiments described above, the raised portions may be provided on both sides of the projection, the raised portion may be provided only on one side of the projection when the area of the raised portion is sufficiently large.

Although in the fourth embodiment described above, the raised portions are respectively provided on one side of the projection T2 in the red semiconductor laser device 200a and on one side of the projection T3 in the infrared semiconductor laser device 300a, the raised portions may be respectively provided on both sides of each of the projections T2 and T3.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor laser apparatus comprising:
a first semiconductor laser device comprising a first substrate, and a first semiconductor layer formed on said first substrate, said first semiconductor layer having a first emission point emitting a light beam having a first wavelength;
a second semiconductor laser device comprising a second semiconductor layer having a second emission point emitting a light beam having a second wavelength; and
a third semiconductor laser device comprising a third semiconductor layer having a third emission point emitting a light beam having a third wavelength,
a surface of said first semiconductor layer that is opposite to said first substrate including a first region and a second region,
said second semiconductor layer being joined to said first region, and said third semiconductor layer being joined to said second region,
a striped first projection being provided on said first region,
a striped second projection being provided on a surface of said second semiconductor layer being joined to said first region,
a striped third projection being provided on a surface of said third semiconductor layer being joined to said second region,
a first raised portion being provided apart from said first projection with a recessed portion therebetween on said first region,
a second raised portion being provided apart from said second projection with a recessed portion therebetween on said surface of said second semiconductor layer, and
the height of said first raised portion being not less than the height of said first projection.

2. The semiconductor laser apparatus according to claim 1, wherein
each of said first raised portions comprises first raised portions provided apart from each of said first projections on both sides thereof.

3. The semiconductor laser apparatus according to claim 1, wherein the spacing between each of said first projections and each of said first raised portions is not less than 5 μm nor more than 150 μm.

4. The semiconductor laser apparatus according to claim 1, wherein
a third raised portion is provided apart from said third projection with a recessed portion therebetween on said surface of said third semiconductor layer, and
the height of said first raised portion is not less than the height of said second projection.

5. The semiconductor laser apparatus according to claim 1, wherein
said second and third semiconductor laser devices being formed on a common substrate.

6. A semiconductor laser apparatus comprising:
a first semiconductor laser device comprising a first substrate, a first semiconductor layer formed on said first substrate, and a first electrode formed on a surface of said first semiconductor layer that is opposite to said first substrate, said first semiconductor layer having a first emission point emitting a light beam having a first wavelength; and
a second semiconductor laser device comprising a second semiconductor layer having a second emission point emitting a light beam having a second wavelength,
said surface of said first semiconductor layer including a first region and a second region,
said first region and said second semiconductor layer being joined to each other,
a striped projection being provided on said first region,
a raised portion being provided apart from said projection with a recessed portion therebetween on said first region,
said first electrode not being joined to said second semiconductor layer in said second region on said raised portion, and
the height of said raised portion is not less than the height of said projection.

7. The semiconductor laser apparatus according to claim 6, wherein
said first electrode is connected to a wire for supply of electric power in said region.

8. The semiconductor laser apparatus according to claim 6, wherein
said first semiconductor laser device is joined to a submount in a surface on the opposite side to said first electrode.

9. The semiconductor laser apparatus according to claim 6, further comprising a third semiconductor laser device comprising a third semiconductor layer having a third emission point emitting a light beam having a third wavelength,
one surface of said third semiconductor layer being joined to said one surface of said first semiconductor layer, and
said one surface of said third semiconductor layer being not joined to said one surface of said first semiconductor layer in said region on said raised portion of said one surface of said first semiconductor layer.

10. The semiconductor laser apparatus according to claim 1, wherein
a second raised portion is provided on said second region, and
said third emission point is positioned on said second raised portion.

11. The semiconductor laser apparatus according to claim 4, wherein said second projection and said third emission point are positioned along a direction substantially perpendicular to said one surface of said third semiconductor layer.

12. The semiconductor laser apparatus according to claim 1, wherein
said first projection and said first emission point are positioned along a direction substantially perpendicular to said one surface of said first semiconductor layer, and
said second projection and said second emission point are positioned along a direction substantially perpendicular to said one surface of said second semiconductor layer.

13. The semiconductor laser apparatus according to claim 1, wherein
said first semiconductor laser device comprises a first active layer and a first cladding layer in this order, said first cladding layer comprising a first flat portion and a first ridge on the flat portion, and said first projection being formed so as to cover said first ridge, and
said second semiconductor laser device comprises a second active layer and a second cladding layer in this order, said second cladding layer comprising a second flat portion and a second ridge on the flat portion, and said second projection being formed so as to cover said second ridge.

14. The semiconductor laser apparatus according to claim 1, wherein said first emission point, and said second emission point are positioned along a direction substantially perpendicular to said one surface of said first semiconductor layer.

15. The semiconductor laser apparatus according to claim 9, wherein
a striped second projection is provided on said one surface of said third semiconductor layer,
a second raised portion is provided apart from said second projection on at least one side thereof on said one surface of said first semiconductor layer and one surface of said third semiconductor layer,
the height of said second raised portion is not less than the height of said second projection, and
said third emission point is positioned on said second raised portion.

16. The semiconductor laser apparatus according to claim 15, wherein said second projection and said third emission point are positioned along a direction substantially perpendicular to said one surface of said third semiconductor layer.

17. The semiconductor laser apparatus according to claim 6, wherein
said first projection and said first emission point are positioned along a direction substantially perpendicular to said one surface of said first semiconductor layer, and
said second projection and said second emission point are positioned along a direction substantially perpendicular to said one surface of said second semiconductor layer.

18. The semiconductor laser apparatus according to claim 6, wherein
said first raised portion comprises first raised portions provided apart from said first projection on both sides thereof, and
said second raised portion comprises second raised portions provided apart from said second projection on both sides thereof.

19. The semiconductor laser apparatus according to claim 6, wherein
said first emission point, and said second emission point are positioned along a direction substantially perpendicular to said one surface of said first semiconductor layer.

* * * * *